US012751328B2

(12) United States Patent
Mrozek et al.

(10) Patent No.: US 12,751,328 B2
(45) Date of Patent: Sep. 29, 2026

(54) DIRECT HYBRID BOND PAD HAVING TAPERED SIDEWALL

(71) Applicant: ADEIA SEMICONDUCTOR BONDING TECHNOLOGIES INC., San Jose, CA (US)

(72) Inventors: Pawel Mrozek, San Jose, CA (US); Gaius Gillman Fountain, Jr., Youngsville, NC (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 408 days.

(21) Appl. No.: 18/319,786

(22) Filed: May 18, 2023

(65) Prior Publication Data

US 2024/0387419 A1 Nov. 21, 2024

(51) Int. Cl.
*H10W 80/00* (2026.01)
*H10W 90/00* (2026.01)
(Continued)

(52) U.S. Cl.
CPC ............ *H10W 90/00* (2026.01); *H10W 72/01* (2026.01); *H10W 72/01951* (2026.01);
(Continued)

(58) Field of Classification Search
CPC ..... H01L 25/0657; H01L 24/80; H01L 24/89; H10W 72/01951; H10W 80/301; H10W 80/312; H10W 90/00
See application file for complete search history.

(56) References Cited

U.S. PATENT DOCUMENTS 4,939,568 A 7/1990 Kato et al.
4,998,665 A 3/1991 Hayashi
(Continued)

FOREIGN PATENT DOCUMENTS

CN 1935630 A 3/2007
CN 110010546 A 7/2019
(Continued)

OTHER PUBLICATIONS

Ngo et al., Plasma Etching of Tapered Features in Silicon for MEMS and Wafer Level Packaging Applications. J Phys: Conference Series; IOP Publishing. Apr. 1, 2006; 34(1):271-276.
(Continued)

*Primary Examiner* — Reema Patel
(74) *Attorney, Agent, or Firm* — Knobbe, Martens, Olson & Bear, LLP

(57) ABSTRACT

An element, a bonded structure that includes the element, and methods of forming the same are disclosed. The element can include a nonconductive field region having a surface defining at least a portion of a bonding surface of the element. The surface of the nonconductive field region is prepared for direct bonding. The element can also include a conductive feature having an upper surface that defines at least a portion of the bonding surface of the element, a lower surface opposite the upper surface, and a sidewall that extends between the upper surface and the lower surface. An angle between the upper surface and the sidewall is about 75° or less. The bonded structure includes the element and a second element directly bonded to one another without an intervening adhesive.

17 Claims, 7 Drawing Sheets

(51) Int. Cl.
*H10W 72/00* (2026.01)
*H10W 72/90* (2026.01)
*H10W 90/20* (2026.01)
*H10W 90/26* (2026.01)

(52) U.S. Cl.
CPC *H10W 72/01953* (2026.01); *H10W 72/07236* (2026.01); *H10W 72/922* (2026.01); *H10W 72/934* (2026.01); *H10W 72/952* (2026.01); *H10W 72/953* (2026.01); *H10W 80/301* (2026.01); *H10W 80/312* (2026.01); *H10W 80/327* (2026.01); *H10W 80/701* (2026.01); *H10W 90/26* (2026.01); *H10W 90/297* (2026.01); *H10W 90/792* (2026.01)

(56) References Cited

U.S. PATENT DOCUMENTS 5,087,585 A 2/1992 Hayashi
5,236,118 A 8/1993 Bower et al.
5,322,593 A 6/1994 Hasegawa et al.
5,413,952 A 5/1995 Pages et al.
5,442,235 A 8/1995 Parrillo et al.
5,489,804 A 2/1996 Pasch
5,501,003 A 3/1996 Bernstein
5,503,704 A 4/1996 Bower et al.
5,516,727 A 5/1996 Broom
5,610,431 A 3/1997 Martin
5,734,199 A 3/1998 Kawakita et al.
5,753,536 A 5/1998 Sugiyama et al.
5,771,555 A 6/1998 Eda et al.
5,821,692 A 10/1998 Rogers et al.
5,866,942 A 2/1999 Suzuki et al.
5,985,739 A 11/1999 Plettner et al.
5,998,808 A 12/1999 Matsushita
6,008,126 A 12/1999 Leedy
6,063,968 A 5/2000 Hubner et al.
6,071,761 A 6/2000 Jacobs
6,080,640 A 6/2000 Gardner et al.
6,097,096 A 8/2000 Gardner et al.
6,123,825 A 9/2000 Uzoh et al.
6,147,000 A 11/2000 You et al.
6,232,150 B1 5/2001 Lin et al.
6,258,625 B1 7/2001 Brofman et al.
6,259,160 B1 7/2001 Lopatin et al.
6,265,775 B1 7/2001 Seyyedy
6,297,072 B1 10/2001 Tilmans et al.
6,316,786 B1 11/2001 Mueller et al.
6,333,120 B1 12/2001 DeHaven et al.
6,333,206 B1 12/2001 Ito et al.
6,348,709 B1 2/2002 Graettinger et al.
6,374,770 B1 4/2002 Lee
6,409,904 B1 6/2002 Uzoh et al.
6,423,640 B1 7/2002 Lee et al.
6,465,892 B1 10/2002 Suga
6,528,894 B1 3/2003 Akram et al.
6,552,436 B2 4/2003 Burnette et al.
6,555,917 B1 4/2003 Heo
6,579,744 B1 6/2003 Jiang
6,583,515 B1 6/2003 James et al.
6,589,813 B1 7/2003 Park
6,600,224 B1 7/2003 Farquhar et al.
6,624,003 B1 9/2003 Rice
6,627,814 B1 9/2003 Stark
6,632,377 B1 10/2003 Brusic et al.
6,660,564 B2 12/2003 Brady
6,667,225 B2 12/2003 Hau-Riege et al.
6,828,686 B2 12/2004 Park
6,837,979 B2 1/2005 Uzoh et al.
6,864,585 B2 3/2005 Enquist
6,887,769 B2 5/2005 Kellar et al.
6,902,987 B1 6/2005 Tong et al.
6,908,027 B2 6/2005 Tolchinsky et al.
6,909,194 B2 6/2005 Farnworth et al.
6,962,835 B2 11/2005 Tong et al.
6,974,769 B2 12/2005 Basol et al.
7,045,453 B2 5/2006 Canaperi et al.
7,078,811 B2 7/2006 Suga
7,105,980 B2 9/2006 Abbott et al.
7,109,063 B2 9/2006 Jiang
7,126,212 B2 10/2006 Enquist et al.
7,157,787 B2 1/2007 Kim et al.
7,193,423 B1 3/2007 Dalton et al.
7,354,798 B2 4/2008 Pogge et al.
7,485,968 B2 2/2009 Enquist et al.
7,750,488 B2 7/2010 Patti et al.
7,803,693 B2 9/2010 Trezza
7,998,335 B2 8/2011 Feeney et al.
8,039,966 B2 10/2011 Yang et al.
8,168,532 B2 5/2012 Haneda et al.
8,183,127 B2 5/2012 Patti et al.
8,241,961 B2 8/2012 Kim et al.
8,242,600 B2 8/2012 Yang et al.
8,314,007 B2 11/2012 Vaufredaz
8,349,635 B1 1/2013 Gan et al.
8,377,798 B2 2/2013 Peng et al.
8,435,421 B2 5/2013 Keleher et al.
8,441,131 B2 5/2013 Ryan
8,476,146 B2 7/2013 Chen et al.
8,476,165 B2 7/2013 Trickett et al.
8,482,132 B2 7/2013 Yang et al.
8,501,537 B2 8/2013 Sadaka et al.
8,524,533 B2 9/2013 Tong et al.
8,620,164 B2 12/2013 Heck et al.
8,647,987 B2 2/2014 Yang et al.
8,697,493 B2 4/2014 Sadaka
8,716,105 B2 5/2014 Sadaka et al.
8,802,538 B1 8/2014 Liu
8,809,123 B2 8/2014 Liu et al.
8,841,002 B2 9/2014 Tong
8,988,299 B2 3/2015 Kam et al.
9,000,600 B2 4/2015 Uzoh et al.
9,093,350 B2 7/2015 Endo et al.
9,142,517 B2 9/2015 Liu et al.
9,171,756 B2 10/2015 Enquist et al.
9,184,125 B2 11/2015 Enquist et al.
9,224,704 B2 12/2015 Landru
9,230,941 B2 1/2016 Chen et al.
9,257,399 B2 2/2016 Kuang et al.
9,269,612 B2 2/2016 Chen et al.
9,299,736 B2 3/2016 Chen et al.
9,312,229 B2 4/2016 Chen et al.
9,331,149 B2 5/2016 Tong et al.
9,337,235 B2 5/2016 Chen et al.
9,343,330 B2 5/2016 Brusic et al.
9,349,669 B2 5/2016 Uzoh et al.
9,368,866 B2 6/2016 Yu
9,385,024 B2 7/2016 Tong et al.
9,394,161 B2 7/2016 Cheng et al.
9,425,136 B2 8/2016 Kuo et al.
9,431,368 B2 8/2016 Enquist et al.
9,437,572 B2 9/2016 Chen et al.
9,443,796 B2 9/2016 Chou et al.
9,461,007 B2 10/2016 Chun et al.
9,496,239 B1 11/2016 Edelstein et al.
9,536,848 B2 1/2017 England et al.
9,559,081 B1 1/2017 Lai et al.
9,620,481 B2 4/2017 Edelstein et al.
9,633,971 B2 4/2017 Uzoh
9,656,852 B2 5/2017 Cheng et al.
9,723,716 B2 8/2017 Meinhold
9,728,521 B2 8/2017 Tsai et al.
9,741,620 B2 8/2017 Uzoh et al.
9,799,587 B2 10/2017 Fujii et al.
9,852,988 B2 12/2017 Enquist et al.
9,881,882 B2 1/2018 Hsu et al.
9,893,004 B2 2/2018 Yazdani
9,899,442 B2 2/2018 Katkar
9,929,050 B2 3/2018 Lin
9,941,241 B2 4/2018 Edelstein et al.
9,941,243 B2 4/2018 Kim et al.
9,953,941 B2 4/2018 Enquist
9,960,142 B2 5/2018 Chen et al.
10,002,844 B1 6/2018 Wang et al.

(56) References Cited

U.S. PATENT DOCUMENTS 10,026,605 B2 7/2018 Doub et al.
10,075,657 B2 9/2018 Fahim et al.
10,147,641 B2 12/2018 Enquist et al.
10,204,893 B2 2/2019 Uzoh et al.
10,269,708 B2 4/2019 Enquist et al.
10,269,756 B2 4/2019 Uzoh
10,276,619 B2 4/2019 Kao et al.
10,276,909 B2 4/2019 Huang et al.
10,418,277 B2 9/2019 Cheng et al.
10,434,749 B2 10/2019 Tong et al.
10,446,456 B2 10/2019 Shen et al.
10,446,487 B2 10/2019 Huang et al.
10,446,532 B2 10/2019 Uzoh et al.
10,508,030 B2 12/2019 Katkar et al.
10,515,913 B2 12/2019 Katkar et al.
10,522,499 B2 12/2019 Enquist et al.
10,707,087 B2 7/2020 Uzoh et al.
10,784,191 B2 9/2020 Huang et al.
10,790,262 B2 9/2020 Uzoh et al.
10,840,135 B2 11/2020 Uzoh
10,840,205 B2 11/2020 Fountain, Jr. et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,923,408 B2 2/2021 Huang et al.
10,923,413 B2 2/2021 DeLaCruz
10,950,547 B2 3/2021 Mohammed et al.
10,964,664 B2 3/2021 Mandalapu et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,056,348 B2 7/2021 Theil
11,088,099 B2 8/2021 Katkar et al.
11,127,738 B2 9/2021 DeLaCruz et al.
11,158,606 B2 10/2021 Gao et al.
11,171,117 B2 11/2021 Gao et al.
11,176,450 B2 11/2021 Teig et al.
11,244,920 B2 2/2022 Uzoh
11,256,004 B2 2/2022 Haba et al.
11,264,345 B2 3/2022 Enquist
11,264,357 B1 3/2022 DeLaCruz et al.
11,276,676 B2 3/2022 Enquist et al.
11,329,034 B2 5/2022 Tao et al.
11,348,898 B2 5/2022 DeLaCruz et al.
11,355,443 B2 6/2022 Huang et al.
11,456,263 B2 9/2022 Wei et al.
11,735,523 B2 8/2023 Uzoh
2002/0000328 A1 1/2002 Motomura et al.
2002/0003307 A1 1/2002 Suga
2002/0025665 A1 2/2002 Juengling
2002/0074670 A1 6/2002 Suga
2002/0094661 A1 7/2002 Enquist et al.
2003/0092220 A1 5/2003 Akram
2003/0157748 A1 8/2003 Kim et al.
2004/0084414 A1 5/2004 Sakai et al.
2006/0024950 A1 2/2006 Choi et al.
2006/0057945 A1 3/2006 Hsu et al.
2007/0096294 A1 5/2007 Ikeda et al.
2007/0111386 A1 5/2007 Kim et al.
2008/0122092 A1 5/2008 Hong
2008/0237053 A1 10/2008 Andricacos et al.
2009/0197408 A1 8/2009 Lehr et al.
2009/0200668 A1 8/2009 Yang et al.
2010/0255262 A1 10/2010 Chen et al.
2010/0327443 A1 12/2010 Kim
2011/0074040 A1 3/2011 Frank et al.
2011/0084403 A1 4/2011 Yang et al.
2012/0211894 A1 8/2012 Aoyagi
2012/0212384 A1 8/2012 Kam et al.
2013/0020704 A1 1/2013 Sadaka
2013/0221527 A1 8/2013 Yang et al.
2013/0252399 A1 9/2013 Leduc
2013/0320556 A1 12/2013 Liu et al.
2014/0153210 A1 6/2014 Uzoh
2014/0175655 A1 6/2014 Chen et al.
2014/0225795 A1 8/2014 Yu
2014/0252635 A1 9/2014 Tran et al.
2014/0264948 A1 9/2014 Chou et al.
2014/0353828 A1 12/2014 Edelstein et al.
2015/0064498 A1 3/2015 Tong
2015/0108644 A1 4/2015 Kuang et al.
2015/0206823 A1 7/2015 Lin et al.
2015/0340269 A1 11/2015 Rivoire et al.
2015/0380368 A1 12/2015 Momose et al.
2016/0020183 A1 1/2016 Chuang et al.
2016/0133598 A1 5/2016 Baudin et al.
2016/0190103 A1 6/2016 Kabe et al.
2016/0276383 A1 9/2016 Chuang et al.
2016/0343682 A1 11/2016 Kawasaki
2017/0047307 A1 2/2017 Uzoh
2017/0069575 A1 3/2017 Haba et al.
2017/0098627 A1 4/2017 Das et al.
2017/0194271 A1 7/2017 Hsu et al.
2017/0355040 A1 12/2017 Utsumi et al.
2018/0151523 A1 5/2018 Chen et al.
2018/0175012 A1 6/2018 Wu et al.
2018/0182639 A1 6/2018 Uzoh et al.
2018/0182665 A1 6/2018 Uzoh et al.
2018/0182666 A1 6/2018 Uzoh et al.
2018/0190580 A1 7/2018 Haba et al.
2018/0190583 A1 7/2018 DeLaCruz et al.
2018/0219038 A1 8/2018 Gambino et al.
2018/0273377 A1 9/2018 Katkar et al.
2018/0295718 A1 10/2018 Uzoh et al.
2018/0323177 A1 11/2018 Yu et al.
2018/0323227 A1 11/2018 Zhang et al.
2018/0331066 A1 11/2018 Uzoh et al.
2019/0096741 A1 3/2019 Uzoh et al.
2019/0115277 A1 4/2019 Yu et al.
2019/0131277 A1 5/2019 Yang et al.
2019/0181122 A1* 6/2019 Hsu ..................... H01L 25/0753
2019/0198407 A1 6/2019 Huang et al.
2019/0198409 A1 6/2019 Katkar et al.
2019/0237419 A1 8/2019 Enquist
2019/0265411 A1 8/2019 Huang et al.
2019/0333550 A1 10/2019 Fisch
2019/0348336 A1 11/2019 Katkar et al.
2019/0385935 A1 12/2019 Gao et al.
2019/0385966 A1 12/2019 Gao et al.
2019/0385982 A1 12/2019 Lee et al.
2019/0393086 A1 12/2019 Uzoh
2020/0006280 A1 1/2020 Shah et al.
2020/0013637 A1 1/2020 Haba
2020/0013765 A1 1/2020 Fountain, Jr. et al.
2020/0035641 A1* 1/2020 Fountain, Jr. ....... H01L 21/7684
2020/0075520 A1 3/2020 Gao et al.
2020/0075553 A1 3/2020 DeLaCruz et al.
2020/0126906 A1 4/2020 Uzoh et al.
2020/0194396 A1 6/2020 Uzoh
2020/0227367 A1 7/2020 Haba et al.
2020/0243380 A1 7/2020 Uzoh et al.
2020/0279821 A1 9/2020 Haba et al.
2020/0294908 A1 9/2020 Haba et al.
2020/0328162 A1 10/2020 Haba et al.
2020/0328164 A1 10/2020 DeLaCruz et al.
2020/0328165 A1 10/2020 DeLaCruz et al.
2020/0335408 A1 10/2020 Gao et al.
2020/0365575 A1 11/2020 Uzoh et al.
2020/0371154 A1 11/2020 DeLaCruz et al.
2020/0381389 A1 12/2020 Uzoh et al.
2020/0395321 A1 12/2020 Katkar et al.
2020/0395339 A1* 12/2020 Chen ....................... H01L 24/06
2020/0411483 A1 12/2020 Uzoh et al.
2021/0043557 A1 2/2021 Lee et al.
2021/0098411 A1 4/2021 Liff et al.
2021/0098412 A1 4/2021 Haba et al.
2021/0118864 A1 4/2021 DeLaCruz et al.
2021/0143125 A1 5/2021 DeLaCruz et al.
2021/0181510 A1 6/2021 Katkar et al.

(56) References Cited

U.S. PATENT DOCUMENTS

| | | | |
|---|---|---|---|
| 2021/0193603 A1 | 6/2021 | Katkar et al. | |
| 2021/0193624 A1 | 6/2021 | DeLaCruz et al. | |
| 2021/0193625 A1 | 6/2021 | DeLaCruz et al. | |
| 2021/0242152 A1 | 8/2021 | Fountain, Jr. et al. | |
| 2021/0257341 A1 | 8/2021 | Lee et al. | |
| 2021/0287981 A1 | 9/2021 | Shih | |
| 2021/0296282 A1 | 9/2021 | Gao et al. | |
| 2021/0305202 A1 | 9/2021 | Uzoh et al. | |
| 2021/0327789 A1 | 10/2021 | Hu et al. | |
| 2021/0335737 A1 | 10/2021 | Katkar et al. | |
| 2021/0366820 A1 | 11/2021 | Uzoh | |
| 2021/0407941 A1 | 12/2021 | Haba | |
| 2022/0005784 A1 | 1/2022 | Gao et al. | |
| 2022/0077063 A1 | 3/2022 | Haba | |
| 2022/0077087 A1 | 3/2022 | Haba | |
| 2022/0077117 A1 | 3/2022 | Yu et al. | |
| 2022/0130787 A1 | 4/2022 | Uzoh | |
| 2022/0139867 A1 | 5/2022 | Uzoh | |
| 2022/0139869 A1 | 5/2022 | Gao et al. | |
| 2022/0165692 A1 | 5/2022 | Uzoh et al. | |
| 2022/0181244 A1 | 6/2022 | Hu | |
| 2022/0208650 A1 | 6/2022 | Gao et al. | |
| 2022/0208702 A1 | 6/2022 | Uzoh | |
| 2022/0208723 A1 | 6/2022 | Katkar et al. | |
| 2022/0246497 A1 | 8/2022 | Fountain, Jr. et al. | |
| 2022/0285213 A1 | 9/2022 | Uzoh et al. | |
| 2022/0285303 A1 | 9/2022 | Mirkarimi et al. | |
| 2022/0302058 A1 | 9/2022 | Gao et al. | |
| 2022/0319901 A1 | 10/2022 | Suwito et al. | |
| 2022/0320035 A1 | 10/2022 | Uzoh et al. | |
| 2022/0320036 A1 | 10/2022 | Gao et al. | |
| 2022/0328447 A1 | 10/2022 | Kao et al. | |
| 2022/0336394 A1 | 10/2022 | Ishikawa et al. | |
| 2022/0384212 A1 | 12/2022 | Chang et al. | |
| 2022/0399295 A1* | 12/2022 | Lai | H01L 24/05 |
| 2023/0005850 A1 | 1/2023 | Fountain, Jr. | |
| 2023/0005970 A1 | 1/2023 | Chen et al. | |
| 2023/0008792 A1 | 1/2023 | Chiang et al. | |
| 2023/0016985 A1 | 1/2023 | Huang | |
| 2023/0019869 A1 | 1/2023 | Mirkarimi et al. | |
| 2023/0036441 A1 | 2/2023 | Haba et al. | |
| 2023/0067677 A1 | 3/2023 | Lee et al. | |
| 2023/0069183 A1 | 3/2023 | Haba | |
| 2023/0100032 A1 | 3/2023 | Haba et al. | |
| 2023/0115122 A1 | 4/2023 | Uzoh et al. | |
| 2023/0122531 A1 | 4/2023 | Uzoh | |
| 2023/0123423 A1 | 4/2023 | Gao et al. | |
| 2023/0125395 A1 | 4/2023 | Gao et al. | |
| 2023/0130259 A1 | 4/2023 | Haba et al. | |
| 2023/0132632 A1 | 5/2023 | Katkar et al. | |
| 2023/0140107 A1 | 5/2023 | Uzoh et al. | |
| 2023/0142680 A1 | 5/2023 | Guevara et al. | |
| 2023/0154816 A1 | 5/2023 | Haba et al. | |
| 2023/0154828 A1 | 5/2023 | Haba et al. | |
| 2023/0187264 A1 | 6/2023 | Uzoh et al. | |
| 2023/0187317 A1 | 6/2023 | Uzoh | |
| 2023/0187412 A1 | 6/2023 | Gao et al. | |
| 2023/0197453 A1 | 6/2023 | Fountain, Jr. et al. | |
| 2023/0197496 A1 | 6/2023 | Theil | |
| 2023/0197559 A1 | 6/2023 | Haba et al. | |
| 2023/0197560 A1 | 6/2023 | Katkar et al. | |
| 2023/0197655 A1 | 6/2023 | Theil et al. | |
| 2023/0207402 A1 | 6/2023 | Fountain, Jr. et al. | |
| 2023/0207437 A1 | 6/2023 | Haba | |
| 2023/0207474 A1 | 6/2023 | Uzoh et al. | |
| 2023/0207514 A1 | 6/2023 | Gao et al. | |
| 2023/0215836 A1 | 7/2023 | Haba et al. | |
| 2023/0245950 A1 | 8/2023 | Haba et al. | |
| 2023/0268300 A1 | 8/2023 | Uzoh et al. | |
| 2023/0299029 A1 | 9/2023 | Theil et al. | |
| 2023/0343734 A1 | 10/2023 | Uzoh et al. | |
| 2023/0360950 A1 | 11/2023 | Gao | |
| 2023/0361074 A1 | 11/2023 | Uzoh et al. | |
| 2023/0369136 A1 | 11/2023 | Uzoh et al. | |
| 2023/0375613 A1 | 11/2023 | Haba et al. | |
| 2023/0380145 A1 | 11/2023 | Chen et al. | |
| 2024/0006383 A1 | 1/2024 | Lee et al. | |
| 2024/0038702 A1 | 2/2024 | Uzoh | |
| 2024/0055407 A1 | 2/2024 | Workman | |
| 2024/0079376 A1 | 3/2024 | Suwito et al. | |
| 2024/0105674 A1 | 3/2024 | Uzoh et al. | |
| 2024/0170411 A1 | 5/2024 | Chang et al. | |
| 2024/0186248 A1 | 6/2024 | Haba et al. | |
| 2024/0186268 A1 | 6/2024 | Uzoh et al. | |
| 2024/0186269 A1 | 6/2024 | Haba | |
| 2024/0203917 A1 | 6/2024 | Katkar et al. | |
| 2024/0213191 A1 | 6/2024 | Theil et al. | |
| 2024/0213210 A1 | 6/2024 | Haba et al. | |
| 2024/0217210 A1 | 7/2024 | Zhao et al. | |
| 2024/0222239 A1 | 7/2024 | Gao et al. | |
| 2024/0222315 A1 | 7/2024 | Uzoh | |
| 2024/0222319 A1 | 7/2024 | Gao et al. | |

FOREIGN PATENT DOCUMENTS

| | | | | |
|---|---|---|---|---|
| CN | 110690202 A | 1/2020 | | |
| CN | 111095532 A | 5/2020 | | |
| CN | 217469903 U | 9/2022 | | |
| JP | 2002-353416 A | 12/2002 | | |
| JP | 2013-033786 A | 2/2013 | | |
| JP | 2018-129475 | 8/2018 | | |
| JP | 2018-160519 | 10/2018 | | |
| KR | 10-2016-0066272 | 6/2016 | | |
| TW | 202343661 A | 11/2023 | | |
| WO | WO 2005/043584 A2 | 5/2005 | | |
| WO | WO 2019/070571 A1 | 4/2019 | | |
| WO | WO 2019/241417 A1 | 12/2019 | | |
| WO | WO 2019/241561 A1 | 12/2019 | | |
| WO | WO 2019/241571 A1 | 12/2019 | | |
| WO | WO 2021/236361 A1 | 11/2021 | | |
| WO | WO-2022183219 A1 * | 9/2022 | | H05K 3/225 |

OTHER PUBLICATIONS

White et al., "Tapered Resist Wall Profiles by Flood Exposure". J Electrochem Society. Dec. 1, 1987;134(12):3125.

International Search Report and Written Opinion issued in Application No. PCT/US2024/019871 on Jul. 9, 2024; 12 pages.

Akolkar, R., "Current status and advances in Damascene Electrodeposition," Encyclopedia of Interfacial Chemistry: Surface Science and Electrochemistry, 2017, 8 pages.

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power- modules-semi-2018-11/ (published Nov. 8, 2018; downloaded Jul. 26, 2023).

Che, F.X. et al., "Study on Cu protrusion of through-silicon via," IEEE Transactions on Components, Packaging and Manufacturing Technology, May 2013, vol. 3, No. 5, pp. 732-739.

Dela Pena, Eden M. et al., "Electrodeposited copper using direct and pulse currents from electrolytes containing low concentration of additives," School of Chemical and Process Engineering, University of Strathclyde, 2018 Surface and Coating Technology, 40 pages.

De Messemaeker, Joke et al., "Correlation between Cu microstructure and TSV Cu pumping," 2014 Electronic Components & Technology Conference, pp. 613-619.

Di Cioccio, L. et al., "An overview of patterned metal/dielectric surface bonding: Mechanism, alignment and characterization," Journal of The Electrochemical Society, 2011, vol. 158, No. 6, p. P81-P86.

Ganesan, Kousik, "Capable copper electrodeposition process for integrated circuit—substrate packaging manufacturing," A dissertation presented in partial fulfillment of the requirements for the degree Doctor of Philosophy, Arizona State University, May 2018, 320 pages.

Gondcharton, P. et al., "Kinetics of low temperature direct copper-copper bonding," Microsyst Technol, 2015, vol. 21, pp. 995-1001.

Heryanto, A. et al., "Effect of copper TSV annealing on via protrusion for TSV wafer fabrication," Journal of Electronic Materials, 2012, vol. 41, No. 9, pp. 2533-2542.

(56) References Cited

OTHER PUBLICATIONS

Hobbs, Anthony et al., "Evolution of grain and micro-void structure in electroplated copper interconnects," Materials Transactions, 2002, vol. 43, No. 7, pp. 1629-1632.
Huang, Q., "Effects of impurity elements on isothermal grain growth of electroplated copper," Journal of The Electrochemical Society, 2018, vol. 165, No. 7, pp. D251-D257.
Huang, Q., "Impurities in the electroplated sub-50 nm Cu lines: The effects of the plating additives," Journal of The Electrochemical Society, 2014, vol. 161, No. 9, pp. D388-D394.
Jiang, T. et al., "Plasticity mechanism for copper extrusion in through-silicon vias for three-dimensional interconnects," Applied Physics Letters, 2013, vol. 103, pp. 211906-1-211906-5.
Juang, Jing-Ye et al., "Copper-to-copper direct bonding on highly (111)-oriented nanotwinned copper in No. vacuum ambient," Scientific Reports, Sep. 17, 2018, vol. 8, 11 pages.
Ker, Ming-Dou et al., "Fully process-compatible layout design on bond pad to improve wire bond reliability in CMOS ICs," IEEE Transactions on Components and Packaging Technologies, Jun. 2002, vol. 25, No. 2, pp. 309-316.
Kim, Myung Jun et al., "Characteristics of pulse-reverse electrodeposited Cu thin film," I. Effects of Anodic Step in the Absence of an Organic Additives, Journal of The Electrochemical Society, 2012, vol. 159, No. 9, pp. D538-D543.
Kim, Myung Jun et al., "Characteristics of pulse-reverse electrodeposited Cu thin film," II. Effects of Organic Additives, Journal of The Electrochemical Society, 2012, vol. 159, No. 9, pp. D544-D548.
Liu, C. et al., "Low-temperature direct copper-to-copper bonding enabled by creep on (111) surfaces of nanotwinned Cu," Scientific Reports, May 12, 2015, 5:09734, pp. 1-11.
Liu, Chien-Min et al., "Effect of grain orientations of Cu seed layers on the growth of <111>-oriented nanotwinned Cu," Scientific Reports, 2014, vol. 4, No. 6123, 4 pages.
Liu, Zi-Yu et al. "Detection and formation mechanism of micro-defects in ultrafine pitch Cu—Cu direct bonding," Chin. Phys. B, 2016, vol. 25, No. 1, pp. 018103-1-018103-7.
Lu, L et al., "Grain growth and strain release in nanocrystalline copper," Journal of Applied Physics, vol. 89, Issue 11, pp. 6408.
Mendez, Julie Marie, "Characterization of copper electroplating and electropolishing processes for semiconductor interconnect metallization," Submitted in partial fulfillment of the requirements for the degree of Doctor of Philosophy, Department of Chemical Engineering, Case Western Reserve University, Aug. 2009, 140 pages.
Menk, L.A et al., "Galvanostatic plating with a single additive electrolyte for bottom-up filling of copper in Mesoscale TSVs," Microsystems and Engineering Sciences Applications (MESA) Complex, Sandia National Laboratories, Albuquerque, New Mexico, 2019 J. Electrochem. Soc. 166, 17 pages.
Moriceau, H. et al., "Overview of recent direct wafer bonding advances and applications," Advances in Natural Sciences-Nanoscience and Nanotechnology, 2010, 11 pages.
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Mott, D. et al., "Synthesis of size-controlled and shaped copper nanoparticles," Langmuir, 2007, vol. 23, No. 10, pp. 5740-5745.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.
ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820."
Ortleb, Thomas et al., "Controlling macro and micro surface topography for a 45nm copper CMP process using a high resolution profiler," Proc. Of SPIE, 2008, vol. 6922, 11 pages.
Parthasaradhy, N.V., "Practical Electroplating Handbook," 1989, Prentice-Hall, Inc., pp. 54-56.
Plobi, A. et al., "Wafer direct bonding: tailoring adhesion between brittle materials," Materials Science and Engineering Review Journal, 1999, R25, 88 pages.
Saraswat, Stanford Presentation, Cu Interconnect slides, web page web.stanford.edu/class/ee311/NOTES/Cu_Interconnect_Slides.pdf, 19 pages.
Song, Xiaohui, "Atomic study of copper-copper bonding using nanoparticles," Journal of Electronic Packaging, Jun. 2020, vol. 142, 5 pages.
Song, Xiaoning, "Microstructure and mechanical properties of electrodeposited copper films," A thesis submitted to the College of Engineering and Physical Sciences of the University of Birmingham, 2011, web page etheses.bham.ac.uk/id/eprint/1764/, 111 pages.
Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Swingle, Karen D., "Nanograin Copper Deposition Using an Impinging Jet Electrode," A Thesis submitted in partial satisfaction of the requirements of the degree of Master of Science, University of California, San Diego, 2013, 102 pages.
Takahashi, K. et al., "Transport phenomena that control electroplated copper filling of submicron vias and trenches," Journal of The Electrochemical Society, 1999, vol. 146, No. 12, pp. 4499-4503.
Zheng, Z. et al., "Study of grain size effect of Cu metallization on interfacial microstructures of solder joints," Microelectronics Reliability, 2019, vol. 99, pp. 44-51.
OmniVision Announces New Family of 20-Megapixel PureCel®Plus-S Sensors for High-End Smartphones. New OV20880 and OV20880-4C Sensors. OmniVision Technologies, Inc. Nov. 7, 2016, 3 pages.
OmniVision 2021 OV202880 images with material analysis, 1 page.
International Preliminary Report on Patentability issued in PCT/US2024/019871 on Nov. 13, 2025; 6 pages.

* cited by examiner

DIRECT HYBRID BOND PAD HAVING TAPERED SIDEWALL

BACKGROUND

Field

The field relates to elements, bonded structures, and methods of forming the elements and bonded structures, and, in particular to elements and bonded structures with a direct hybrid bond pad having a tapered sidewall.

Description of the Related Art

Microelectronic elements, such as integrated device dies or chips, may be mounted or stacked on other elements thereby forming a bonded structure. Direct metal bonding can be conducted at low temperatures and without external pressure. For example, direct hybrid bonding involves directly bonding non-conductive features (e.g., inorganic dielectrics) of different elements together, without intervening adhesives, while or subsequently also directly bonding conductive features (e.g., metal pads or lines) of the elements together. For example, a microelectronic element can be mounted to a carrier, such as an interposer, a reconstituted wafer or element, etc. As another example, a microelectronic element can be stacked on top of another microelectronic element, e.g., a first integrated device die can be stacked on a second integrated device die. Each of the microelectronic elements can have conductive pads for mechanically and electrically bonding the elements to one another. There is a continuing need for improved methods for forming the bonded structure.

BRIEF DESCRIPTION OF THE DRAWINGS

Specific implementations will now be described with reference to the following drawings, which are provided by way of example, and not limitation.

DETAILED DESCRIPTION

Figure 1A:
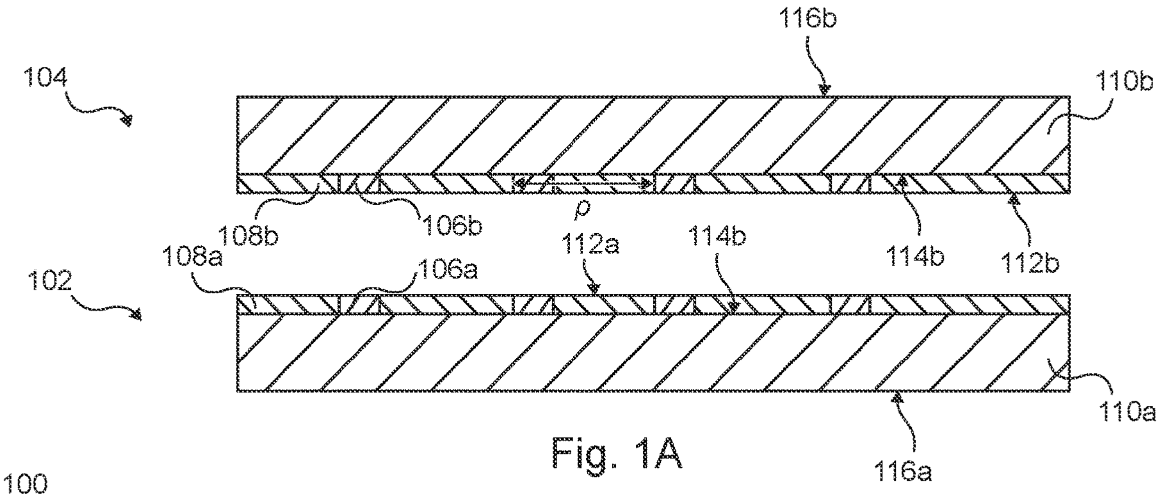
FIG. 1A is a schematic cross-sectional side view of two elements prior to direct bonding.
Figure 1B:
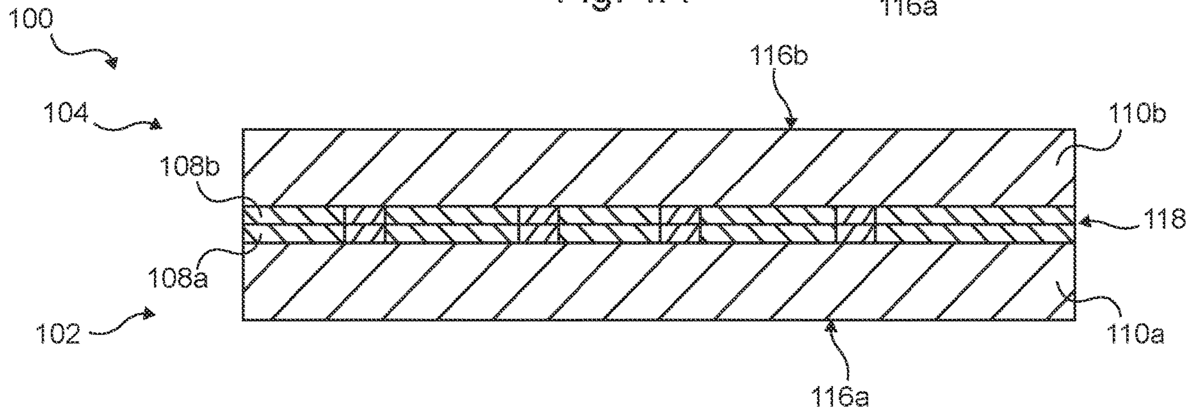
FIG. 1B is a schematic cross-sectional side view of the two elements shown in FIG. 1A after direct bonding.

Various embodiments disclosed herein relate to directly bonded (e.g., hybrid bonded) structures in which two or more elements can be directly bonded (e.g., hybrid bonded) to one another without an intervening adhesive. FIGS. 1A and 1B schematically illustrate a process for forming a directly bonded (e.g., hybrid bonded) structure without an intervening adhesive according to some embodiments. In FIGS. 1A and 1B, a bonded structure 100 comprises two elements 102 and 104 that can be directly bonded (e.g., hybrid bonded) to one another at a bond interface 118 without an intervening adhesive. Two or more microelectronic elements 102 and 104 (such as semiconductor elements, including, for example, integrated device dies, wafers, passive devices, individual active devices such as power switches, etc.) may be stacked on or bonded to one another to form the bonded structure 100. Conductive features 106*a* (e.g., contact pads, traces, exposed ends of vias through substrate electrodes or vias) of the first element 102 may be electrically connected to corresponding conductive features 106*b* of the second element 104. Any suitable number of elements can be stacked in the bonded structure 100. For example, a third element (not shown) can be stacked on the second element 104, a fourth element (not shown) can be stacked on the third element, and so forth. Additionally or alternatively, one or more additional elements (not shown) can be stacked laterally adjacent one another along the first element 102. In some embodiments, the laterally stacked additional element may be smaller than the second element 104. In some embodiments, the laterally stacked additional element may be two times smaller than the second element 104.

In some embodiments, the elements 102 and 104 are directly bonded (e.g., hybrid bonded) to one another without an intervening adhesive. In various embodiments, a non-conductive field region that includes a non-conductive or dielectric material can serve as a first bonding layer 108*a* of the first element 102 which can be directly bonded to a corresponding non-conductive field region that includes a non-conductive or dielectric material serving as a second bonding layer 108*b* of the second element 104 without an intervening adhesive. The non-conductive bonding layers 108*a* and 108*b* can be disposed on respective front sides 114*a* and 114*b* of device portions 110*a* and 110*b*, such as a semiconductor (e.g., silicon) portion of the elements 102, 104, or back-end-of-line (BEOL) interconnect layers over such semiconductor portions. Active devices (e.g., transistors) and/or circuitry can be patterned and/or otherwise disposed in or on the device portions 110*a* and 110*b*. Active devices and/or circuitry can be disposed at or near the front sides 114*a* and 114*b* of the device portions 110*a* and 110*b*, and/or at or near opposite backsides 116*a* and 116*b* of the device portions 110*a* and 110*b*. Bonding layers can be provided on front sides and/or back sides of the elements, either at the wafer level during device fabrication, or in a subsequent process, such as in a redistribution layer (RDL) formation in a packaging facility. The non-conductive material can be referred to as a non-conductive bonding region or bonding layer 108*a* of the first element 102. In some embodiments, the non-conductive bonding layer 108*a* of the first element 102 can be directly bonded to the corresponding non-conductive bonding layer 108*b* of the second element 104 using dielectric-to-dielectric bonding techniques. For example, non-conductive or dielectric-to-dielectric bonds may be formed without an intervening adhesive using the bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers 108*a* and/or 108*b* can comprise a non-conductive material such as a dielectric material (e.g., silicon oxide), or an undoped semiconductor material (e.g., undoped silicon). Suitable dielectric bonding surface or materials for direct bonding include but are not limited to inorganic dielectrics including silicon (such as silicon oxide, silicon nitride, or silicon oxynitride), or carbon (such as silicon carbide, silicon oxycarbonitride, low K dielectric materials, SiCOH dielectrics, silicon carbonitride, diamond-like carbon or a material comprising a diamond surface). Such carbon-containing ceramic materials can be considered inorganic, despite the inclusion of carbon. In some embodiments, the dielectric materials do not comprise polymer materials, such as epoxy, resin or molding materials.

In some embodiments, the device portions 110*a* and 110*b* can have a significantly different coefficients of thermal expansion (CTEs) defining a heterogenous structure. The CTE difference between the device portions 110*a* and 110*b*, and particularly between bulk semiconductor, typically single crystal portions of the device portions 110*a*, 110*b*, can be greater than 5 ppm or greater than 10 ppm. For example, the CTE difference between the device portions 110*a* and 110*b* can be in a range of 5 ppm to 100 ppm, 5 ppm to 40 ppm, 10 ppm to 100 ppm, or 10 ppm to 40 ppm. In some embodiments, one of the device portions 110*a* and 110*b* can comprise optoelectronic single crystal materials, including perovskite materials, that are useful for optical piezoelectric or pyroelectric applications, and the other of the device portions 110*a*, 110*b* comprises a more conventional substrate material. For example, one of the device portions 110*a*, 110*b* comprises lithium tantalate (LiTaO3) or lithium niobate (LiNbO3), and the other one of the device portions 110*a*, 110*b* comprises silicon, quartz, fused silica glass, sapphire, or a glass. In other embodiments, one of the device portions 110*a* and 110*b* comprises a III-V single semiconductor material, such as gallium arsenide (GaAs) or gallium nitride (GaN), and the other one of the device portions 110*a* and 110*b* can comprise a non-III-V semiconductor material, such as silicon, or can comprise other materials with similar CTE, such as quartz, fused silica glass, sapphire, or a glass.

In various embodiments, direct bonds (e.g., hybrid bonds) can be formed without an intervening adhesive. For example, nonconductive bonding surfaces 112*a* and 112*b* can be polished to a high degree of smoothness. The nonconductive bonding surfaces 112*a* and 112*b* can be polished using, for example, chemical mechanical polishing (CMP). The roughness of the polished bonding surfaces 112*a* and 112*b* can be less than 30 Å rms. For example, the roughness of the bonding surfaces 112*a* and 112*b* can be in a range of about 0.1 Å rms to 15 Å rms, 0.5 Å rms to 10 Å rms, or 1 Å rms to 5 Å rms. The bonding surfaces 112*a* and 112*b* can be cleaned and exposed to a plasma and/or etchants to activate the surfaces 112*a* and 112*b*. In some embodiments, the surfaces 112*a* and 112*b* can be terminated with a species after activation or during activation (e.g., during the plasma and/or etch processes). Without being limited by theory, in some embodiments, the activation process can be performed to break chemical bonds at the bonding surfaces 112*a* and 112*b*, and the termination process can provide additional chemical species at the bonding surfaces 112*a* and 112*b* that improves the bonding energy during direct bonding (e.g., hybrid bonding). In some embodiments, the activation and termination are provided in the same step, e.g., a plasma to activate and terminate the surfaces 112*a* and 112*b*. In other embodiments, the bonding surfaces 112*a* and 112*b* can be terminated in a separate treatment to provide the additional species for direct bonding (e.g., hybrid bonding). In various embodiments, the terminating species can comprise nitrogen. For example, in some embodiments, the bonding surface(s) 112*a*, 112*b* can be exposed to a nitrogen-containing plasma. In some embodiments, activation and/or termination can be achieved by exposure to oxygen-containing plasma. Further, in some embodiments, the bonding surfaces 112*a* and 112*b* can be exposed to fluorine. For example, there may be one or multiple fluorine peaks at or near a bond interface 118 between the first and second elements 102, 104. Thus, in the bonded structure 100, the bond interface 118 between two non-conductive materials (e.g., the bonding layers 108*a* and 108*b*) can comprise a very smooth interface with higher nitrogen content and/or fluorine peaks at the bond interface 118. Additional examples of activation and/or termination treatments may be found throughout U.S. Pat. Nos. 9,564,414; 9,391,143; and 10,434,749, the entire contents of each of which are incorporated by reference herein in their entirety and for all purposes. The roughness of the polished bonding surfaces 112*a* and 112*b* can be slightly rougher (e.g., about 1 Å rms to 30 Å rms, 3 Å rms to 20 Å rms, or possibly rougher) after an activation process.

In various embodiments, conductive features 106*a* of the first element 102 can also be directly bonded to corresponding conductive features 106*b* of the second element 104 without an intervening adhesive (e.g., without solder or other conductive adhesive intervening between the conductive features 106*a*, 106*b*). For example, a direct bonding (e.g., hybrid bonding) technique can be used to provide conductor-to-conductor direct bonds along the bond interface 118 that includes covalently bonded non-conductive-to-non-conductive (e.g., dielectric-to-dielectric) surfaces, prepared as described above. In various embodiments, the conductor-to-conductor (e.g., conductive feature 106*a* to conductive feature $\mathbf{106}_b$) bonds and the dielectric-to-dielectric bonds can be formed using the direct bonding (e.g., hybrid bonding) techniques disclosed at least in U.S. Pat. Nos. 9,716,033 and 9,852,988, the entire contents of each of which are incorporated by reference herein in their entirety and for all purposes. In direct bonding (e.g., hybrid bonding) embodiments described herein, conductive features are provided within non-conductive bonding layers, and both conductive and nonconductive features are prepared for direct bonding (e.g., hybrid bonding), such as by the planarization, activation and/or termination treatments described above. Thus, the bonding surface prepared for direct bonding (e.g., hybrid bonding) includes both conductive and non-conductive features.

For example, non-conductive (e.g., dielectric) bonding surfaces 112*a*, 112*b* (for example, inorganic dielectric surfaces) can be prepared and directly bonded to one another without an intervening adhesive as explained above. Conductive contact features (e.g., conductive features 106*a* and 106*b* which may be at least partially surrounded by non-conductive dielectric field regions within the bonding layers 108*a*, 108*b*) may also directly bond to one another without an intervening adhesive. In various embodiments, the conductive features 106*a*, 106*b* can comprise discrete pads or traces at least partially embedded in the non-conductive field regions. In some embodiments, the conductive contact features can comprise exposed contact surfaces of through substrate vias (e.g., through silicon vias (TSVs)). In some embodiments, the respective conductive features 106*a* and 106*b* can be recessed below exterior (e.g., upper) surfaces (non-conductive bonding surfaces 112*a* and 112*b*) of the dielectric field region or non-conductive bonding layers 108*a* and 108*b*, for example, recessed by less than 30 nm, less than 20 nm, less than 15 nm, or less than 10 nm, for example, recessed in a range of 2 nm to 20 nm, or in a range of 4 nm to 10 nm. The recess can be at or near the middle or center of the cavity in which the conductive features 106*a*, 106*b* are disposed, and, additionally or alternatively, can extend or be disposed along sides of the cavity in which the conductive features 106*a*, 106*b* are disposed. In various embodiments, prior to direct bonding (e.g., hybrid bonding), the recesses in the opposing elements can be sized such that the total gap between opposing contact pads is less than 15 nm, or less than 10 nm. The non-conductive bonding layers 108*a* and 108*b* can be directly bonded to one another without an intervening adhesive at room temperature in some embodiments and, subsequently, the bonded structure 100 can be annealed. Upon annealing, the conductive features 106*a* and 106*b* can expand and contact one another to form a metal-to-metal direct bond. Beneficially, the use of Direct Bond Interconnect, or DBI®, techniques commercially available from Adeia of San Jose, CA, can enable high density of conductive features 106*a* and 106*b* to be connected across the bond interface 118 (e.g., small or fine pitches for regular arrays). In some embodiments, a pitch p of the conductive features 106*a* and 106*b*, such as conductive traces embedded in the bonding surface of one of the bonded elements, may be less than 100 μm or less than 10 μm or even less than 2 μm. For some applications, the ratio of the pitch of the conductive features 106*a* and 106*b* to one of the dimensions (e.g., a diameter) of the bonding pad is less than is less than 20, or less than 10, or less than 5, or less than 3 and sometimes desirably less than 2. In other applications, the width of the conductive traces embedded in the bonding surface of one of the bonded elements may range between about 0.3 μm to 50 μm, e.g., in a range of about 0.3 μm to 20 μm, about 0.3 μm to 3 μm, about 0.5 μm to 50 μm, about 0.75 μm to 25 μm, or about 1 μm to 5 μm. In various embodiments, the conductive features 106*a* and 106*b* and/or traces can comprise copper or copper alloys, although other metals may be suitable. For example, the conductive features disclosed herein, such as the conductive features 106*a* and 106*b*, can comprise aluminum or a fine-grain metal (e.g., a fine-grain copper). Further, a major lateral dimension (e.g., a pad diameter) can be small as well, e.g., in a range of about 0.25 μm to 30 μm, in a range of about 0.25 μm to 5 μm, or in a range of about 0.5 μm to 5 μm.

Thus, in direct bonding (e.g., hybrid bonding) processes, the first element 102 can be directly bonded (e.g., hybrid bonded) to the second element 104 without an intervening adhesive. In some arrangements, the first element 102 can comprise a singulated element, such as a singulated integrated device die. In other arrangements, the first element

102 can comprise a carrier or substrate (e.g., a wafer) that includes a plurality (e.g., tens, hundreds, or more) of device regions that, when singulated, form a plurality of integrated device dies. Similarly, the second element 104 can comprise a singulated element, such as a singulated integrated device die. In other arrangements, the second element 104 can comprise a carrier or substrate (e.g., a wafer). The embodiments disclosed herein can accordingly apply to wafer-to-wafer (W2W), die-to-die (D2D), or die-to-wafer (D2W) bonding processes. In W2W processes, two or more wafers can be directly bonded (e.g., hybrid bonded) to one another and singulated using a suitable singulation process. After singulation, side edges of the singulated structure (e.g., the side edges of the two bonded elements) may be substantially flush and may include markings indicative of the common singulation process for the bonded structure (e.g., saw markings if a saw singulation process is used).

As explained herein, the first and second elements 102 and 104 can be directly bonded (e.g., hybrid bonded) to one another without an intervening adhesive, which is different from a deposition process and results in a structurally different interface compared to a deposition. In one application, a width of the first element 102 in the bonded structure is similar to a width of the second element 104. In some other embodiments, a width of the first element 102 in the bonded structure 100 is different from a width of the second element 104. Similarly, the width or area of the larger element in the bonded structure may be at least 10% larger than the width or area of the smaller element. The first and second elements 102 and 104 can accordingly comprise non-deposited elements. Further, bonded structures 100, unlike deposited layers, can include a defect region along the bond interface 118 in which nanometer-scale voids (nanovoids) are present. The nanovoids may be formed due to activation of the bonding surfaces 112*a* and 112*b* (e.g., exposure to a plasma). As explained above, the bond interface 118 can include concentration of materials from the activation and/or last chemical treatment processes. For example, in embodiments that utilize a nitrogen plasma for activation, a nitrogen peak can be formed at the bond interface 118. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen peak can be formed at the bond interface 118. In some embodiments, the bond interface 118 can comprise silicon oxynitride, silicon oxycarbonitride, or silicon carbonitride. As explained herein, the direct bond can comprise a covalent bond, which is stronger than van Der Waals bonds. The bonding layers 108*a* and 108*b* can also comprise polished surfaces that are planarized to a high degree of smoothness.

In various embodiments, the metal-to-metal bonds between the conductive features 106*a* and 106*b* can be joined such that metal grains grow into each other across the bond interface 118. In some embodiments, the metal is or includes copper, which can have grains oriented along the 111 crystal plane for improved copper diffusion across the bond interface 118. In some embodiments, the conductive features 106*a* and 106*b* may include nanotwinned copper grain structure, which can aid in merging the conductive features during anneal. The bond interface 118 can extend substantially entirely to at least a portion of the bonded conductive features 106*a* and 106*b*, such that there is substantially no gap between the non-conductive bonding layers 108*a* and 108*b* at or near the bonded conductive features 106*a* and 106*b*. In some embodiments, a barrier layer may be provided under and/or laterally surrounding the conductive features 106*a* and 106*b* (e.g., which may include copper). In other embodiments, however, there may be no barrier layer under the conductive features 106*a* and 106*b*, for example, as described in U.S. Pat. No. 11,195,748, which is incorporated by reference herein in its entirety and for all purposes.

As described above, the non-conductive bonding layers 108*a*, 108*b* can be directly bonded to one another without an intervening adhesive and, subsequently, the bonded structure 100 can be annealed. Anneal temperatures can vary depending upon thermal budgets for the devices, size of the conductive features 106*a*, 106*b*, size of the gap between conductive features 106*a*, 106*b*, materials for the conductive features 106*a*, 106*b* and surrounding non-conductive layers 108*a*, 108*b* and their relative CTEs, etc. Example temperatures for annealing include between about 50° C. and 400° C., between about 100° C. and 300° C., and between about 150° C. and 250° C. Upon annealing, the conductive features 106*a*, 106*b* can expand and contact one another to form a metal-to-metal direct bond. In some embodiments, the materials of the conductive features 106*a*, 106*b* can interdiffuse during the annealing process.

Embodiments described herein can reduce stress in the conductive features 106*a*, 106*b*. Contact or bonding pads shaped as described hereinbelow can reduce residual stresses compared to conventional pads, and consequently reduce wafer or die bowing.

As described herein, the bonding surfaces 112*a* and 112*b* of the element can be polished in preparation for direct bonding (e.g., hybrid bonding). When the bonding surfaces 112*a* and 112*b* of the non-conductive bonding layers 108*a*, 108*b* are polished, there can be dielectric rounding at a region of the bonding surfaces 112*a* and 112*b* adjacent to the conductive features 106*a*, 106*b*. Dielectric rounding can decrease the overall bonding strength and integrity of the bond. This can lead to delamination or separation of the bonded layers over time, especially when the bonded structure is subjected to thermal or mechanical stress. Also, dielectric rounding can lead to the formation of voids or air gaps between the bonded layers, which can negatively impact the electrical and optical properties of the device. Various embodiments disclosed herein relate to structures that can prevent and/or reduce formation of dielectric rounding during the polishing process by reducing stress at the edges of conductive features 106*a*, 106*b*.

As described above, the use of the direct bonding (e.g., hybrid bonding) techniques described herein can enable extremely fine pitch between adjacent conductive features 106*a* and 106*b*, and/or small pad sizes. However, when the pitch between adjacent conductive features 106*a* and 106*b* is small, there can be undesirable parasitic capacitance between the adjacent conductive features 106*a* and 106*b*, especially for higher frequency performance. Various embodiments disclosed herein relate to structures that can reduce such parasitic capacitance without increasing the pitch.

Figure 2:
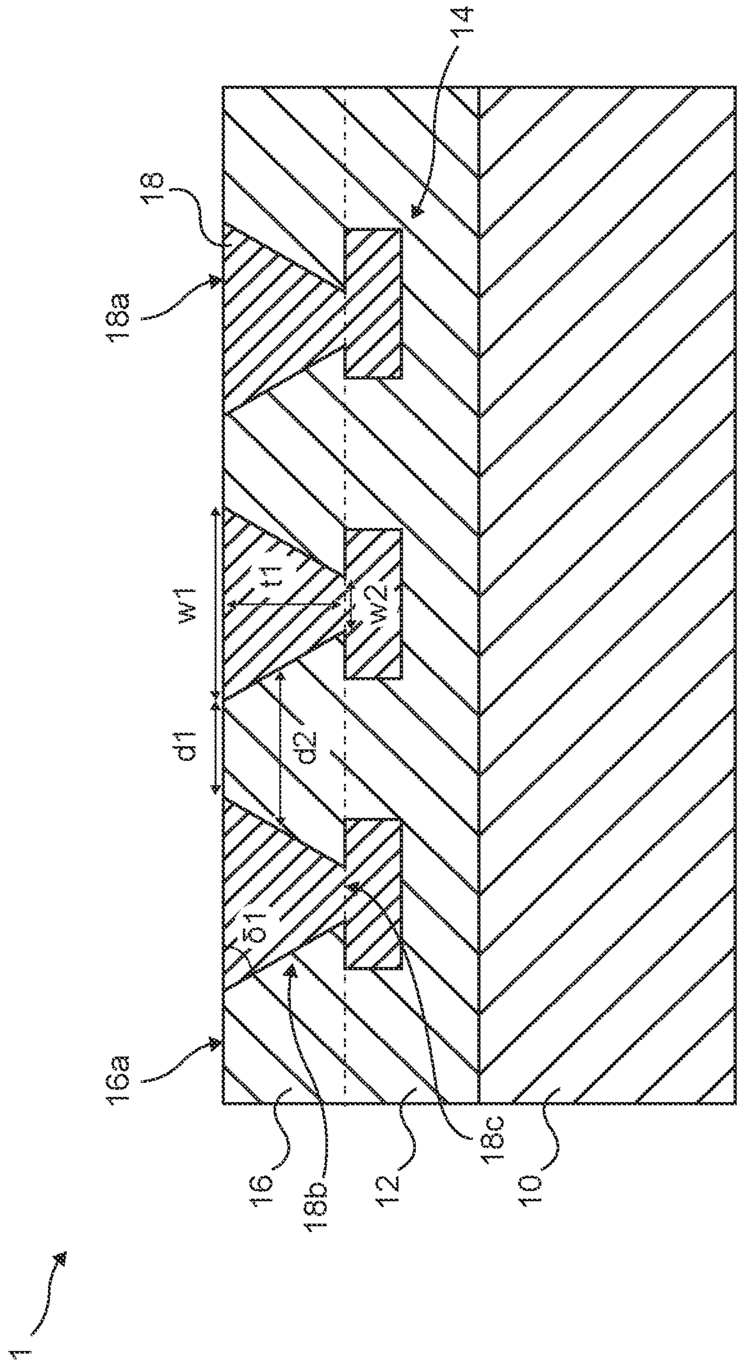
FIG. 2 is a schematic cross-sectional side view of an element according to an embodiment.

FIG. 2 is a schematic cross-sectional side view of an element 1 according to an embodiment. The element 1 can include a device portion 10, a back end of line (BEOL) structure 12 that includes an interconnect structure 14, a dielectric layer 16, and a conductive feature (e.g., conductive pads 18). As is known in the art, for an integrated circuit, the BEOL structure 12 can include multiple interconnect layers, including patterned traces and vias separated from one another by interlevel dielectrics (ILD). However, the skilled artisan will appreciate that principles and advantages taught herein are applicable to much simpler structures, such as individual surface mount devices, which may include simple contact leads without BEOL layers. A contact surface of the element 1 includes a surface 16*a* of the dielectric layer 16 and an upper surface 18*a* of the contact pad 18, which can also be referred to as a bonding or contact surface. The dielectric layer 16 can also be referred to as a nonconductive field region.

The device portion 10 can be a semiconductor (e.g., silicon) portion of the element 1. Active devices (e.g., transistors) and/or circuitry can be patterned and/or otherwise disposed in or on the device portion 10. While illustrated as a landing pad, the skilled artisan will appreciate that the interconnect structure 14 can take the form of routing metal lines or traces, an interlevel via, a through substrate via, or a landing pad that can electrically connect to the conductive pad 18. The interconnect structure 14 can be part of or above the BEOL structure 12 as shown, or can be part of or above a RDL. In some embodiments, the via of the interconnect structure 14 can have a width in a range of, for example, about 0.1 μm to 0.5 μm, or about 0.2 μm to 0.4 μm.

The dielectric layer 16 has a bonding surface 16*a*, which can be polished to a high degree of smoothness. The bonding surface 16*a* can be polished using, for example, CMP. The roughness of the bonding surface 16*a* can be less than 30 Å rms. For example, the roughness of the bonding surface 16*a* can be in a range of about 0.1 Å rms to 15 Å rms, about 0.5 Å rms to 10 Å rms, or about 1 Å rms to 5 Å rms.

The contact pad 18, such as a copper pad, has the upper or bonding surface 18*a*, a sidewall 18*b*, and a lower side or surface 18*c*. The sidewall 18*b* can extend between the upper surface 18*a* and the lower surface 18*c*. An internal angle δ1 between the bonding surface 18*a* and the sidewall 18*b* is acute, and can be equal to or less than about 75°, less than about 70°, less than about 60°, or less than about 50°. For example, the angle δ1 between the bonding surface 18*a* and the sidewall 18*b* can be in a range of about 30° to 75°, about 35° to 75°, about 30° to 70°, about 35° to 70°, about 30° to 60°, about 35° to 60°, about 30° to 50°, or about 35° to 50°. As an example, the angle δ1 between the bonding surface 18*a* and the sidewall 18*b* can be about 45°, such as 45±5°. In some embodiments, there can be an intervening layer (not shown) between the contact pad 18 and the dielectric layer 16. The intervening layer can include a seed layer and/or a barrier layer (e.g., a diffusion barrier layer). The intervening layer can have a multi-layer structure, in some embodiments.

In some embodiments, a cavity formed in the dielectric layer 16 in which the contact pad 18 is disposed can be formed by way of dry etching (e.g., plasma etching) using a patterned photoresist, whether or not directional, or by way of controlled isotropic etching (e.g., wet etching or certain dry vapor etching). To form conventional contact pads of an element for direct bonding (e.g., hybrid bonding), particularly for high density pads, a skilled artisan may avoid highly sloped sidewalls, in order to form a precisely sized contact pads for direct bonding (e.g., hybrid bonding). Rather, contact pads for direct bonding (e.g., hybrid bonding) typically are arranged to have close to 90° angles, or close to vertical sidewalls relative to a horizontal contact surface of the element. However, in the present disclosure, the contact pad 18 is arranged to have highly sloped sidewalls, with a relatively small angle δ1.

Forming the cavity in the dielectric layer 16 for the contact pad 18 to have sloped sidewalls as disclosed herein can facilitate significant advantages, as such the angles can reduce stress and lead to the formation of dielectric rounding during a polishing (e.g., CMP) process.

The bonding or upper surface 18*a* of the contact pad 18 has a width w1 and the lower side or surface 18*c* of the contact pad 18 that contacts the interconnect structure 14 has a width w2 that is smaller than the width w1. In some embodiments, the contact pad 18 can be formed at a wafer level, and the width w1 of the bonding surface 18*a* of the contact pad 18 can be in a range of about 0.5 μm to 20 μm, about 0.5 μm to 10 μm, about 0.5 μm to 5 μm, about 0.5 μm to 1 μm, about 1 μm to 5 μm, or about 1 μm to 10 μm. In some embodiments, the contact pad 18 can be formed at a package level, and the width w1 of the bonding surface 18*a* of the contact pad 18 can be in a range of 20 μm to 200 μm, 20 μm to 100 μm, 40 μm to 200 μm, or 400 μm to 100 μm. Due to the tapered shape, the width w1 may be adjusted during a polishing process—when the contact pad 18 is polished more, the width w1 of the contact pad 18 can be smaller.

The contact pad 18 has a thickness t1. In some embodiments, a thickness of the dielectric layer 16 can be equal to or greater than the thickness t1. For example, the thickness t1 of the contact pad 18 can be in a range of 0.5 μm to 3 μm, 1 μm to 3 μm, or 1 μm to 2 μm. In some embodiments, the bonding surface 18*a* can be recessed relative to the bonding surface 16*a* of the dielectric layer 16. For example, the bonding surface 18*a* can be recessed relative to the bonding surface 16*a* of the dielectric layer 16 in a range of 2 nm to 20 nm, or in a range of 4 nm to 10 nm.

A distance d1 between the bonding surfaces 18*a* of adjacent contact pads 18 can be measured at the bonding surface 16*a*, whether or not the contact pad 18 is recessed. An average distance d2 is an average distance between sidewalls 18*b* of the adjacent contact pads 18. If the internal angle δ1 between the bonding surface 18*a* and the sidewall 18*b* of the contact pad were 90°, the distance d1 and the average distance d2 would be the same. However, because the sidewall 18*b* has an acute angle δ1 as disclosed herein, the average distance d2 is greater than the distance d1 at the upper surface. Therefore, parasitic capacitance can be reduced when the sidewall 18*b* is sloped inwardly as disclosed herein.

The element 1 can be bonded to another element (a second element) to form a bonded structure. In some embodiments, the second element can have an identical or generally similar structure as the element 1. In some other embodiments, the second element can be configured to directly bond (e.g., hybrid bond) to the element 1 but have a different structure from the element 1. As noted above, the elements being bonded can individually be identical or different dies, wafers, passive or active components, etc.

Figure 3:
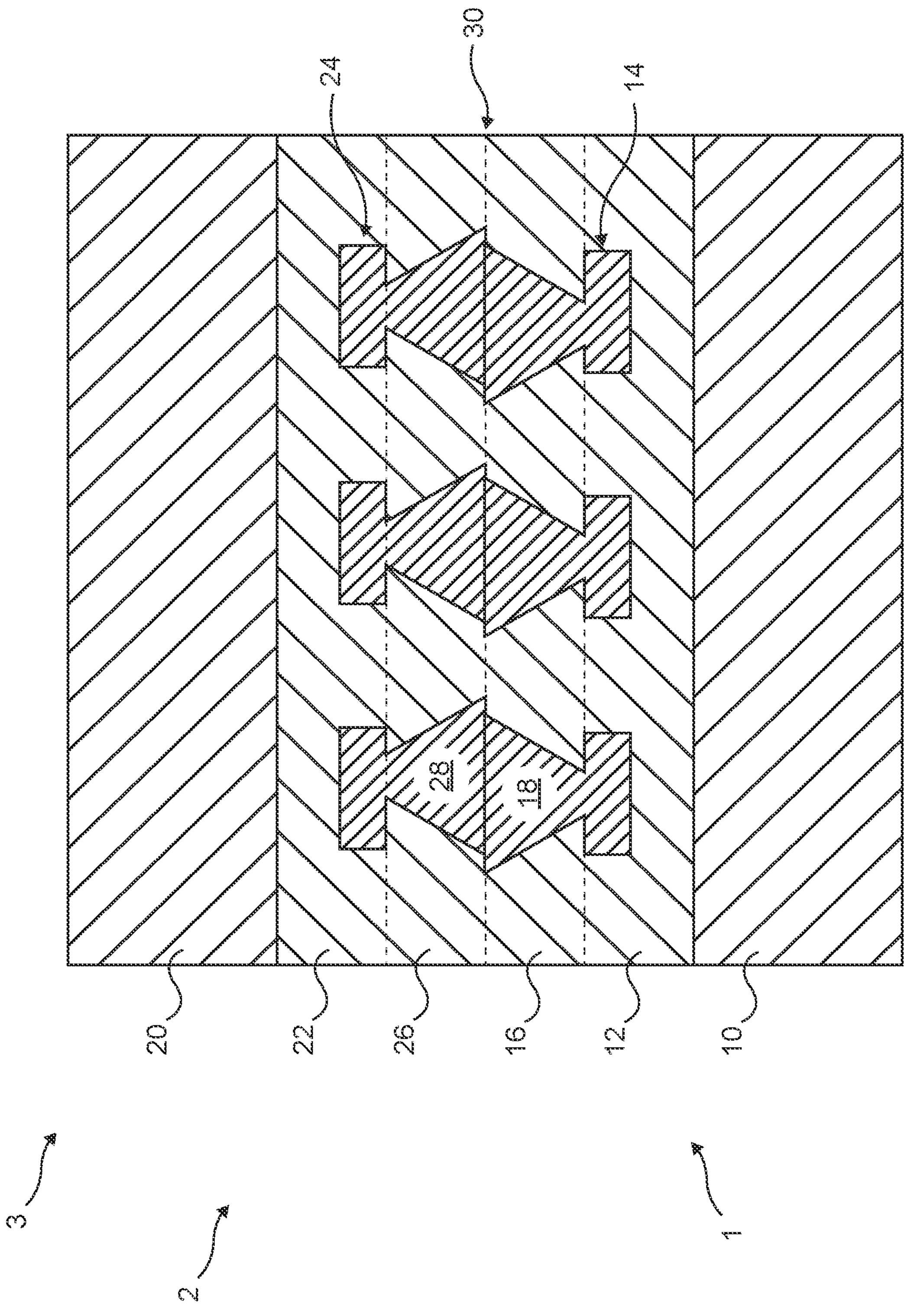
FIG. 3 is a schematic cross-sectional side view of bonded elements (a first element and a second element) that at least partially define a bonded structure, according to an embodiment.

FIG. 3 is a schematic cross-sectional side view of bonded elements (a first element 1 and a second element 2) that at least partially define a bonded structure 3, according to an embodiment. Unless otherwise noted, similarly named or labeled components of FIG. 3 can be the same as or generally similar to the corresponding components of FIG. 2.

The first element 1 can include a first device portion 10, a first BEOL structure 12 that includes a first interconnect structure 14, a first dielectric layer 16, and a first conductive feature (e.g., conductive pads 18). The second element 2 can include a second device portion 20, a second BEOL structure 22 that includes a second interconnect structure 24, a second dielectric layer 26, and a second conductive feature (e.g., conductive pads 28). The first and second elements 1, 2 can be directly bonded (e.g., hybrid bonded) to one another along a bond interface 30 without an intervening adhesive. The first and second dielectric layers 16, 26 can be directly bonded to one another along the bond interface 30 without an intervening adhesive, and the first and second conductive pads 18, 28 can be directly bonded to one another along the bond interface 30 without an intervening adhesive.

In some arrangements, the first element 1 can comprise a singulated element, such as a singulated integrated device die. In other arrangements, the first element 1 can comprise a carrier or substrate (e.g., a wafer) that includes a plurality (e.g., tens, hundreds, or more) of device regions that, when singulated, form a plurality of integrated device dies. Similarly, the second element 2 can comprise a singulated element, such as a singulated integrated device die. In other arrangements, the second element 2 can comprise a carrier or substrate (e.g., a wafer). The embodiments disclosed herein can accordingly apply to wafer-to-wafer, die-to-die, or die-to-wafer bonding processes. In wafer-to-wafer processes, two or more wafers can be directly bonded (e.g., hybrid bonded) to one another and subsequently singulated using a suitable singulation process. After singulation, side edges of the singulated structure (e.g., the side edges of the two bonded elements) may be substantially flush and may include markings indicative of the common singulation process for the bonded structure (e.g., saw markings if a saw singulation process is used).

There can be any suitable number of the conductive pads 18 included in the first element 1. The conductive pads 18 can be distributed at or near a bonding surface of the first element 1 in any suitable manner. For example, the conductive pads 18 can be distributed evenly or periodically, non-periodically, symmetrically, non-symmetrically, and/or randomly along the bonding surface of the first second element 1. Likewise, there can be any suitable number of the conductive pads 28 included in the second element 2. The conductive pads 218 can be distributed at or near a bonding surface of the second element 2 in any suitable manner. For example, the conductive pads 28 can be distributed evenly or periodically, non-periodically, symmetrically, non-symmetrically, and/or randomly along the bonding surface of the second element 2. In some embodiments, the conductive pads 18, 28 can be distributed so as to reduce or control parasitic capacitance between two or more of the conductive pads 18, 28 and/or to reduce or control stress. At least some pads 18 of the first element 1 correspond in location to pads 28 of the second element, so that they can be aligned for hybrid direct bonding. However, not all pads 18, 28 on the elements 1, 2 need to be aligned with one another, particularly when the elements include dummy pads.

Figures 4A, 4B, 4C, 4D:
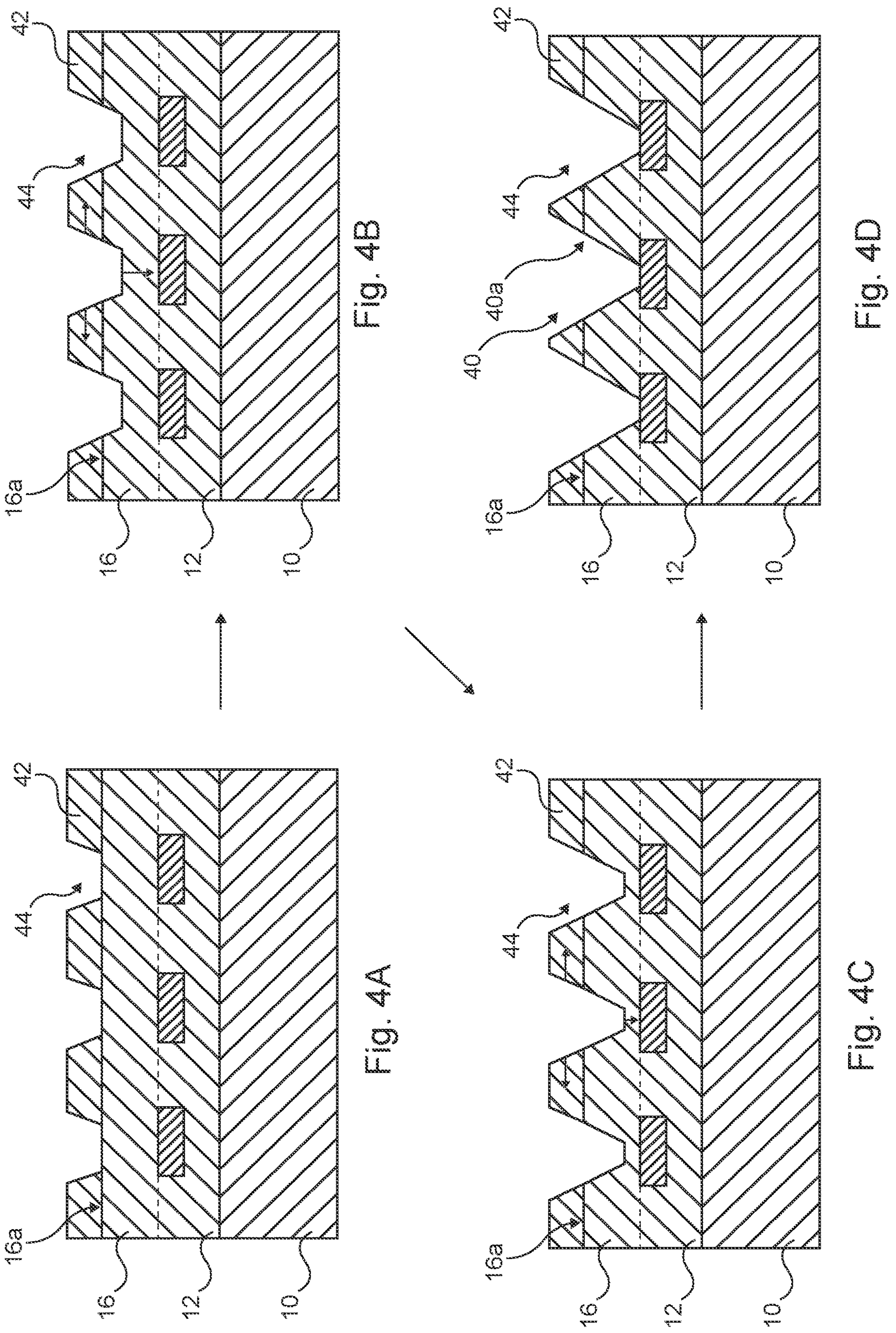
FIG. 4A is a schematic cross-sectional side view of a structure that includes a device portion, a back end of line (BEOL) structure disposed over the device portion, a dielectric layer disposed over the BEOL structure, and a patterned resist layer disposed over the dielectric layer.
FIG. 4B is a schematic cross-sectional side view of the structure of FIG. 4A at a first stage of forming cavities.
FIG. 4C is a schematic cross-sectional side view of the structure of FIG. 4A at a second stage of forming the cavities after the first stage.
FIG. 4D is a schematic cross-sectional side view of the structure of FIG. 4A after the cavities are fully formed.
Figure 5A:
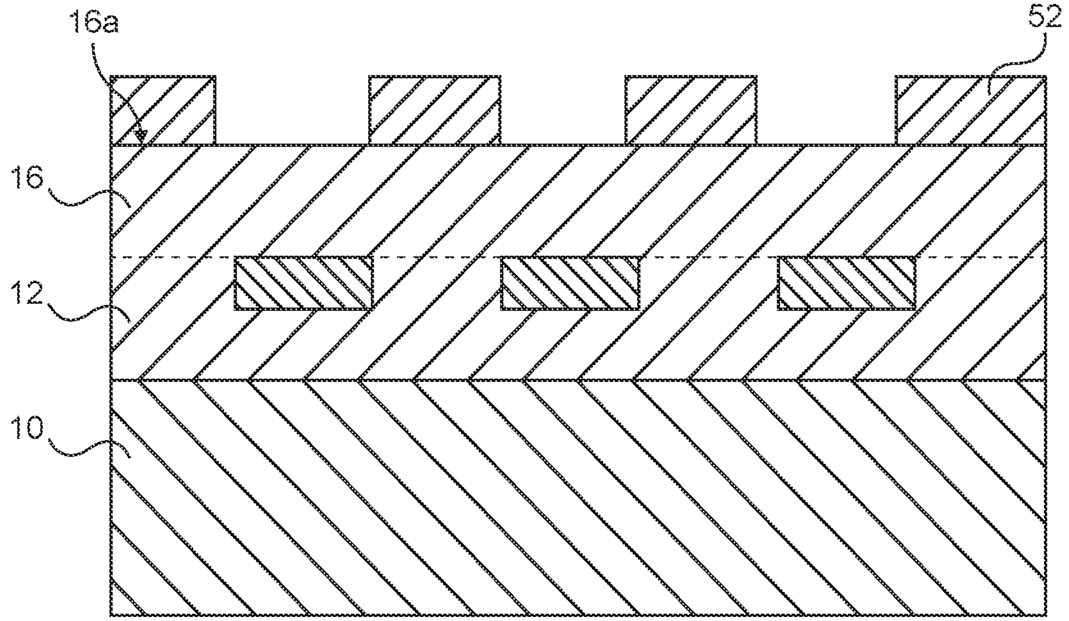
FIG. 5A is a schematic cross-sectional side view of a structure that includes a device portion, a back end of line (BEOL) structure disposed over the device portion, a dielectric layer disposed over the BEOL structure, and a patterned resist layer disposed over the dielectric layer.
Figure 5B:
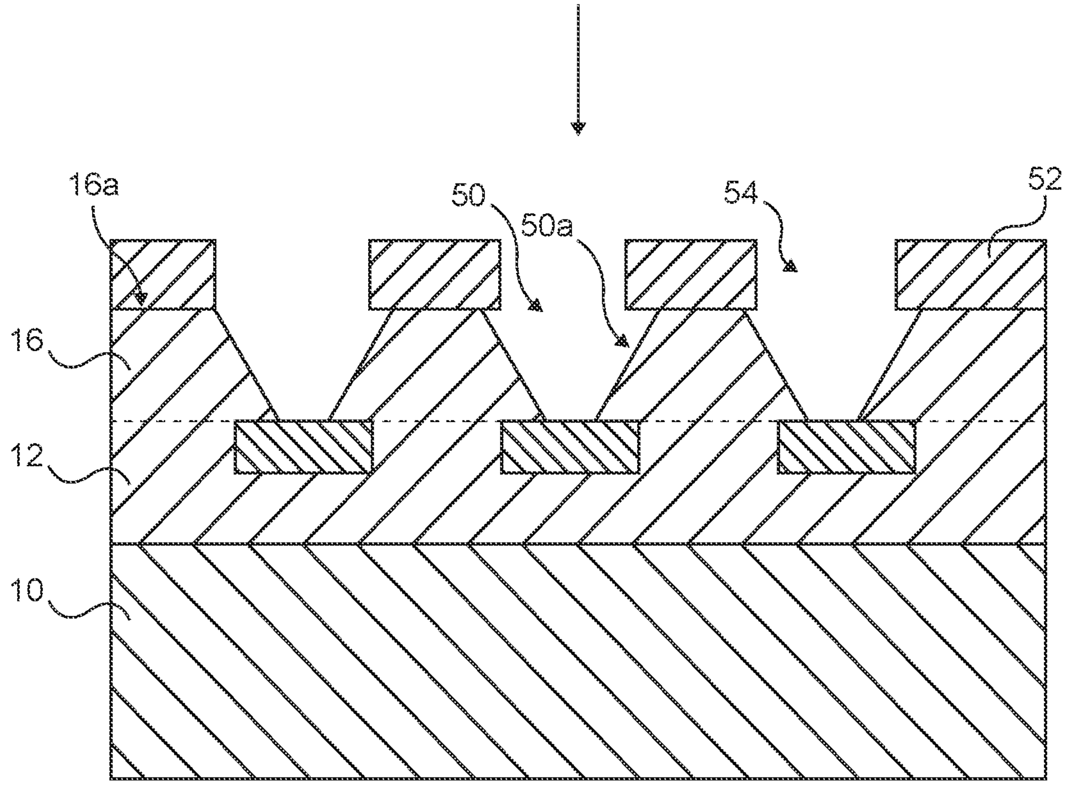
FIG. 5B is a schematic cross-sectional side view of the structure of FIG. 5A after cavities are formed.
Figure 6A:
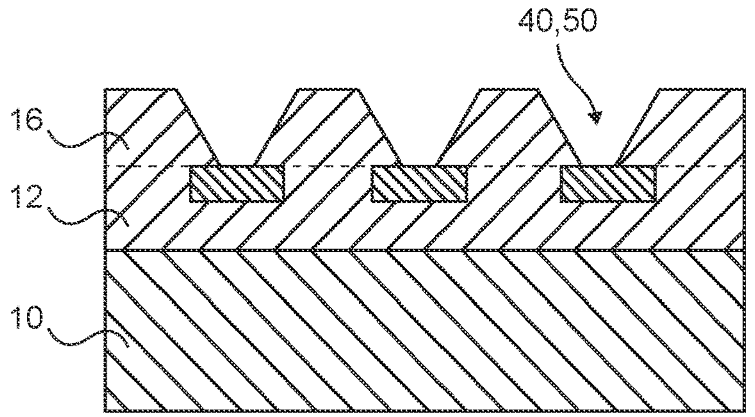
FIG. 6A shows the structures of FIG. 4B or 5B without the patterned resist layer.
Figure 6B:
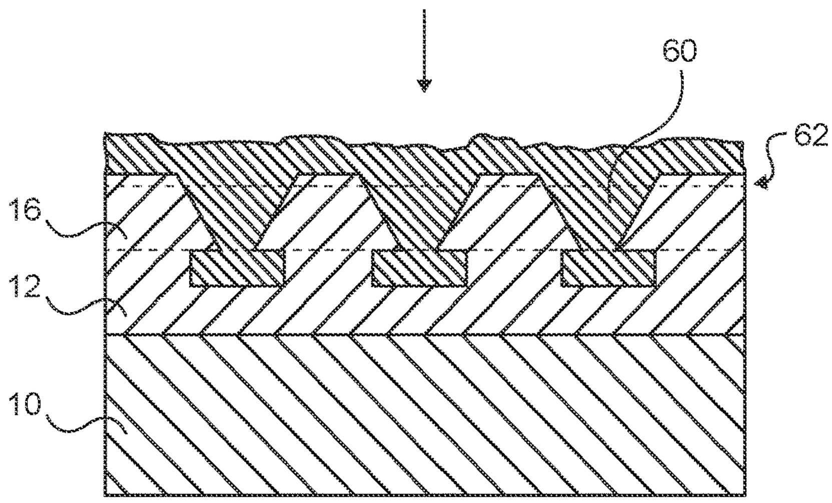
FIG. 6B shows the structure of FIG. 6A after providing a conductive material.
Figure 6C:
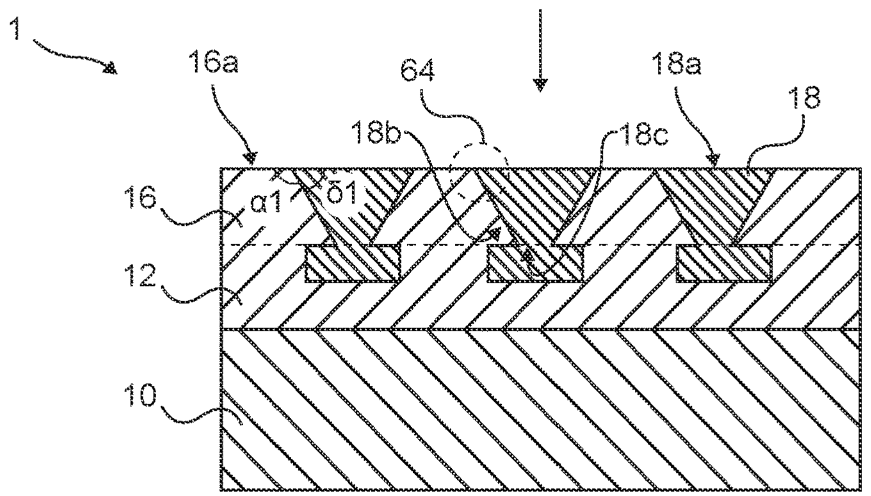
FIG. 6C shows the structure of FIG. 6B after a planarization process.

Methods of forming conductive pads with an acute internal angle δ1 between a bonding surface and a sidewall in a range of, for example, 30° to 75°, 35° to 75°, 30° to 70°, 35° to 70°, 30° to 60°, 35° to 60°, 30° to 50°, or 35° to 50°, will be described referring to FIGS. 4A-6C. FIGS. 4A and 4B show a process of forming a plurality of cavities 40 according to an embodiment. FIGS. 5A and 5B show another process of forming a plurality of cavities 50 according to an embodiment. FIGS. 6A to 6C show a process of defining a bonding surface of an element 1 according to an embodiment.

FIG. 4A is a schematic cross-sectional side view of a structure that includes a device portion 10, a BEOL structure 12 disposed over the device portion, a dielectric layer 16 disposed over the BEOL structure 12, and a patterned resist layer 42 disposed over the dielectric layer 16. FIG. 4B is a schematic cross-sectional side view of the structure at a first stage of forming the cavities 40. FIG. 4C is a schematic cross-sectional side view of the structure at a second stage of forming the cavities 40 after the first stage. FIG. 4D is a schematic cross-sectional side view of the structure after the cavities 40 are fully formed. The patterned resist layer 42 can have openings 44 that are shaped in accordance with a desired shape of the cavity 40 formed in FIG. 4D.

The patterned resist layer 42 can be patterned by way of photolithography. The patterned resist layer 42 can be patterned by using different baking methods to control the sidewall angle, or using a multi-exposure (e.g., a double exposure) method having a first exposure with the pattern and a second blanket exposure followed by a development process. Thus, known techniques can provide a controlled slope shape for the photoresist at the openings 44. The resist layer 42 can be used directly as a mask, or its pattern can be transferred to a hard mask layer prior to etching of the dielectric layer 16. As will be understood by the skilled artisan, similar effects can be obtained by providing a stepped profile for the resist.

Exposed areas of the dielectric layer 16 can be etched away by way of dry etching, such as reactive ion etching (RIE) or deep reactive ion etching (DRIE). The etching process can remove materials from the dielectric layer 16 in a controlled manner, following the patterned resist layer 42 as a guide. As the etching progresses, the shaped photoresist is also eroded, withdrawing and widening (as illustrated with horizontal arrows in FIGS. 4B and 4C) the openings as the etch into the dielectric layer 16 proceeds. Thus, in later stages of the etch, the dielectric layer 16 at outer edges of the openings 44 are newly exposed to the etch, and thus etched for a shorter time, while central portions of the openings 44 are exposed from the beginning and thus etched for a longer time (generally in a direction shown with a vertical arrow in FIGS. 4B and 4C). Accordingly, tapered sidewalls 40*a* of the cavity 40 can be formed. The etching process can be designed to be anisotropic. In addition to engineering the shape of the resist, the shape of the etched cavities 40 can be influenced by the selectivity between resist and exposed dielectric of any chemical component of the etch. Thus, the slope of the openings can be controlled.

FIG. 5A is a schematic cross-sectional side view of a structure that includes a device portion 10, a BEOL structure 12 disposed over the device portion, a dielectric layer 16 disposed over the BEOL structure 12, and a patterned resist layer 52 disposed over the dielectric layer 16. FIG. 5B is a schematic cross-sectional side view of the structure after the cavities 50 are formed. The patterned resist layer 52 can be pattered by way of photolithography. In contrast to the anisotropic etching process described with respect to FIGS. 4A to 4D, FIGS. 5A and 5B show an isotropic etching process (e.g., an isotropic wet etching or isotropic vapor etching process) for forming the cavities 50.

Exposed areas of the dielectric layer 16 can be etched away by use of a chemical etchant solution that can selectively dissolve the dielectric material of the dielectric layer 16 to thereby form the cavity 50 with a tapered sidewall 50*a*. The etchant solution can be chosen to have a relatively high selectivity for the dielectric material over the patterned resist layer 52, so that the patterned resist layer 52 can act as a mask to guide the etching process. In some embodiments, the etchant solution can include hydrofluoric acid. For example, the etchant solution can be a mixture of hydrofluoric acid and water, such as 1:10 HF:$H_2O$, or buffered HF.

In certain isotropic etching processes, a tapered sidewall in a cavity can naturally occur. Typically such tapered sidewalls are avoided or minimized in metallization processes, particularly for fine dimensions, in order to have vertical sidewalls and thus better fidelity between the mask openings and the metal dimensions. In the illustrated embodiment, the isotropic etch etches the dielectric layer 16 both vertically and horizontally. In some embodiments, rates of the vertical and horizontal etching may be controlled. The rates of the vertical and horizontal etching may be affected at least in part by, for example, resist adhesion and/or dielectric structural properties of the dielectric layer 16. The horizontal component of the etching can occur for a longer duration at a top portion of the dielectric layer 16 closer to the bonding surface 16*a* than a lower portion of the dielectric layer 16 closer to the BEOL structure 12. The duration of the horizontal component of the etching can be gradually shorter as it gets closer to the lower portion. Therefore, the dielectric layer 16 can be etched less in the horizontal direction at the lower portion than the top portion so as to define the tapered sidewall 50*a* The outer edges of the cavities 50 thus extend under the resist 52, and those newly exposed dielectric surfaces are exposed to the etch for less time than central portions of the openings 54, and as a result the cavities 50 have sloped sidewalls.

FIG. 6A shows the structures of FIGS. 4B and 5B without the patterned resist layer 42 or 52. FIG. 6B shows the structure of FIG. 6A after providing a conductive material 60. The conductive material 60 can be provided at least partially in the cavities 40, 50. In some embodiments, the conductive material 60 can be provided to overfill the cavities 40, 50 such that at least a portion of the dielectric layer 16 over the bonding surface 16*a* is covered by the conductive material 60. The dashed line 62 indicates a target grind or polish stop line for forming a bonding surface of the element 1.

In some embodiments, an intervening layer (not shown) can be provided between the contact pad 18 and the dielectric layer 16. The intervening layer can include a seed layer and/or a barrier layer (e.g., a diffusion barrier layer). The intervening layer can have a multi-layer structure, in some embodiments.

FIG. 6C shows the element 1 after a planarization process (e.g., a CMP process). In the planarization process, at least a portion of the conductive material 60 and/or at least a portion of the dielectric layer 16 can be removed. The bonding surface 16*a* of the dielectric layer 16 can be polished to a high degree of smoothness. The bonding surface 16*a* can be polished to have a surface roughness in a range of about 0.1 Å rms to 15 Å rms, 0.5 Å rms to 10 Å rms, or 1 Å rms to 5 Å rms. In some embodiments, the upper surface 18*a* of the contact pad 18 can be recessed (not shown) relative to the bonding surface 16*a* of the dielectric layer 16. For example, the bonding surface 18*a* can be recessed relative to the bonding surface 16*a* of the dielectric layer 16 in a range of 2 nm to 20 nm, or in a range of 4 nm to 10 nm.

An acute internal angle δ1 between the bonding surface 18*a* and the pad sidewall 18*b* can be equal to or less than 75°, 70°, 60°, or 50°. For example, the angle δ1 between the bonding surface 18*a* and the sidewall 18*b* can be in a range of 30° to 75°, 35° to 75°, 30° to 70°, 35° to 70°, 30° to 60°, 35° to 60°, 30° to 50°, or 35° to 50°. An obtuse external angle α1 between the dielectric bonding surface 16*a* and the sidewall 40*a*, 50*a* of the cavity 40, 50 can be about 180° minus the internal angle δ1 between the bonding surface 18*a* and the sidewall 18*b*. The external angle α1 between the dielectric bonding surface 16*a* and the sidewall 40*a*, 50*a* in various embodiments disclosed herein can be more than 100°, 105°, 110°, 120°, or 130°. For example, the angle α1 between the dielectric bonding surface 16*a* and the sidewall 40*a*, 50*a* of the cavity 40, 50 can be in a range of 105° to 150°, 105° to 145°, 110° to 150°, 110° to 145°, 120° to 150°, 120° to 145°, 130° to 150°, or 130° to 145°.

A known problem associated with a planarization process (e.g., a CMP process) in a conventional element is dielectric rounding or eroding at or near a portion between a bonding surface of a dielectric layer and a bonding surface of a conductive pad. During the CMP process, the material removal rate can vary depending on, for example, the local surface topography of the element and stresses in the dielectric and conductive materials exposed to the polish. These stresses can cause the polishing pad to preferentially polish the dielectric material at the corners adjacent the contact pad, resulting in the rounding of the dielectric corners. The embodiments of the present disclosure can prevent or mitigate formation of dielectric rounding at or near a corner 64 between the bonding surface 16*a* of the dielectric layer 16 and the bonding surface 18*a* of the conductive pad 18. Selecting the angles α1, δ1 of the sidewalls 40*a*, 50*a*, 18*b* as disclosed herein can provide such advantages.

In some embodiments, the sidewall 40*a*, 50*a* of the cavity 40, 50 can have a generally straight line and/or a conical profile. In some other embodiments, the sidewall 40*a*, 50*a* of the cavity 40, 50 can have curvature (see FIGS. 7A and 7B) or steps. The sidewall 18*b* of the conductive pad 18 can conform to the sidewall 40*a*, 50*a* of the cavity 40, 50.

Figure 7A:
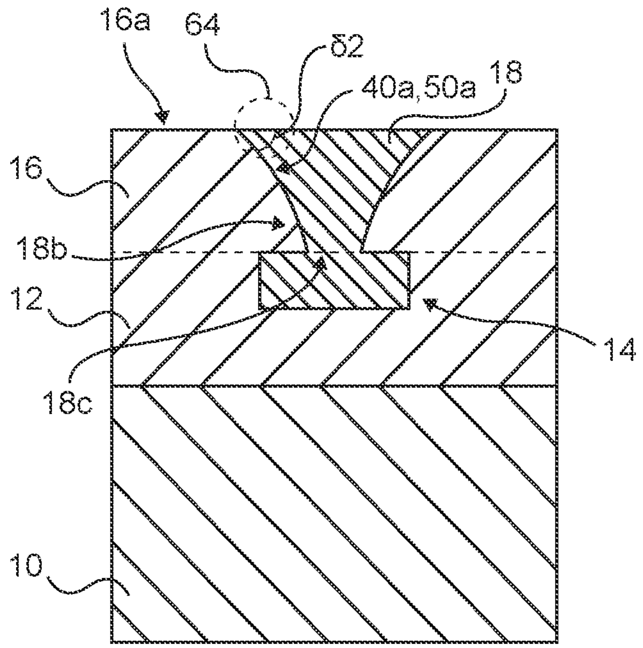
FIG. 7A is a schematic cross-sectional side view of a portion of an element according to an embodiment.
Figure 7B:
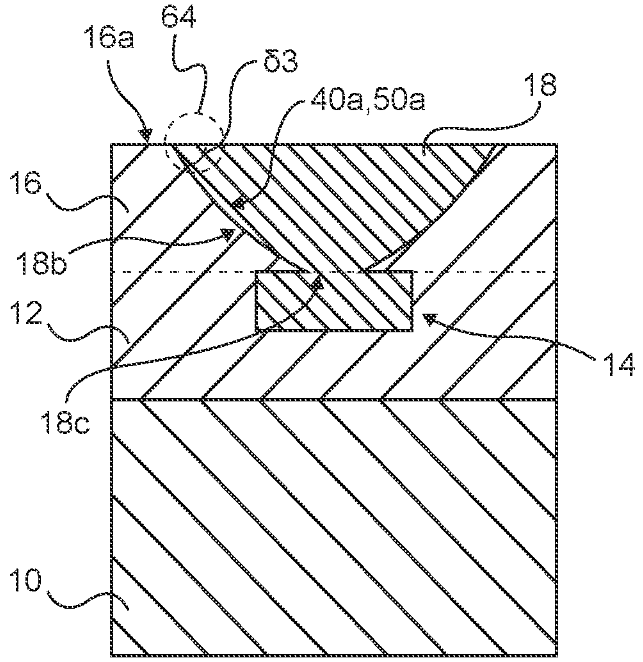
FIG. 7B is a schematic cross-sectional side view of a portion of an element according to another embodiment.

FIG. 7A is a schematic cross-sectional side view of a portion of an element according to an embodiment. FIG. 7B is a schematic cross-sectional side view of a portion of an element according to another embodiment. Unless otherwise noted, similarly named or labeled components of FIGS. 7A and 7B can be the same as or generally similar to the corresponding components of FIG. 2. In FIG. 7A, the sidewall 40*a*, 50*a* has a convex curvature and the sidewall 18*b* of the conductive pad 18 has a concave curvature. In FIG. 7B, the sidewall 40*a*, 50*a* has a concave curvature and the pad sidewall 18*b* has a convex curvature. The angles δ2, δ3 between the bonding surface 18*a* and the sidewall 18*b* can be the same as or generally similar to the angle δ1 disclosed herein, and can be measured at the corner 64, or can be an average slope for the sidewall 18*b*.

In one aspect, a first element configured to directly bond to a second element, is disclosed. The first element can include a nonconductive field region that has a surface defining at least a portion of a bonding surface of the first element. The surface of the nonconductive field region is prepared for direct bonding to the second element. The first element can include a conductive feature that has an upper surface defining at least a portion of the bonding surface of the first element, a lower surface opposite the upper surface, and a sidewall extending between the upper surface and the lower surface. An angle between the upper surface and the sidewall is about 75° or less.

In one embodiment, the angle between the upper surface and the sidewall is in a range of about 30° to 70°.

In one embodiment, the angle between the upper surface and the sidewall is in a range of about 30° to 60°.

In one embodiment, the angle between the upper surface and the sidewall is in a range of about 35° to 50°.

In one embodiment, the conductive feature is a contact pad and a thickness of the contact pad is in a range of about 1 μm to 2 μm. A width of the contact pad can be in a range of about 0.5 μm to 20 μm. The first element can further include a back-end-of-line structure below the nonconductive field region. The back-end-of-line structure can have a via electrically connected to the contact pad.

In one embodiment, the upper surface of the conductive feature is recessed relative to the surface of the nonconductive field region by about 2 nm to 20 nm.

In one aspect, a bonded structure is disclosed. The bonded structure can include a first element that includes a first nonconductive field region having a first surface defining at least a portion of a bonding surface of the first element, and a first conductive feature having a first upper surface defining at least a portion of the bonding surface of the first element, a first lower surface opposite the first upper surface, and a first sidewall extending between the first upper surface and the first lower surface. An angle between the first upper surface and the first sidewall is about 75° or less. The bonded structure can include a second element that includes a second nonconductive field region having a second surface directly bonded to the first surface of the first nonconductive field region, and a second conductive feature directly bonded to the first conductive feature.

In one embodiment, the angle between the first upper surface and the first sidewall is in a range of about 30° to 70°.

In one embodiment, the angle between the first upper surface and the first sidewall is in a range of about 30° to 60°.

In one embodiment, the angle between the first upper surface and the first sidewall is in a range of about 35° to 50°.

In one embodiment, the first conductive feature is a contact pad and a thickness of the contact pad is in a range of 1 μm to 2 μm, and a width of the contact pad is in a range of about 0.5 μm to 20 μm.

In one embodiment, the first upper surface of the first conductive feature is recessed relative to the first surface of the first nonconductive field region by about 2 nm to 20 nm.

In one embodiment, the second conductive feature has a second upper surface directly bonded to the first conductive feature, a second lower surface opposite the second upper surface of the second conductive feature, and a second sidewall extending between the second upper surface and the second lower surface of the second conductive feature. An angle between the second upper surface and the second sidewall of the second conductive feature can be about 75° or less.

In one aspect, a method of forming a conductive pad of an element is disclosed. The method can include forming a patterned resist layer over at least a portion of a surface of a dielectric layer, removing portions of the dielectric layer by etching to form a cavity having an angle between a sidewall of the cavity and the surface of the dielectric layer, providing a conductive material to at least partially fill the cavity with the conductive material, and polishing at least the surface of the dielectric layer to prepare for direct bonding. The angle is greater than about 105°.

In one embodiment, the patterned resist layer has a shape that conforms to a shape of the cavity, and the etching comprises dry etching.

In one embodiment, the etching includes isotropic etching.

In one embodiment, the angle between the sidewall of the cavity and the surface of the dielectric layer is in a range of about 110° to 150°.

In one embodiment, the sidewall of the cavity has a curvature.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. For example, while illustrated embodiments include preparation for direct hybrid bonding, the skilled artisan will appreciate that the techniques taught herein can be useful for direct metal bonding even in the absence of direct dielectric bonding. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. It is also contemplated that various combinations or sub-combinations of the specific features and aspects of the embodiments may be made and still fall within the scope. The accompanying claims and their equivalents are intended to cover such forms or modifications as would fall within the scope and spirit of the disclosure.

What is claimed is:

1. A first element configured to directly bond to a second element, the first element comprising:

a nonconductive field region having a surface defining at least a portion of a bonding surface of the first element, the surface of the nonconductive field region being prepared for direct bonding to the second element; and a conductive feature having an upper surface defining at least a portion of the bonding surface of the first element, a lower surface opposite the upper surface, and a sidewall connecting and extending between the upper surface and the lower surface, wherein an angle between the upper surface and the sidewall is in a range of 30° to 70° such that the upper surface is wider than the lower surface.

2. The first element of claim 1, wherein the angle between the upper surface and the sidewall is in a range of 30° to 60°.

3. The first element of claim 1, wherein the angle between the upper surface and the sidewall is in a range of 35° to 50°.

4. The first element of claim 1, wherein the conductive feature is a contact pad and a thickness of the contact pad is in a range of 1 μm to 2 μm.

5. The first element of claim 4, wherein a width of the contact pad is in a range of 0.5 μm to 20 μm.

6. The first element of claim 5, further comprising a back-end-of-line structure below the nonconductive field region, the back-end-of-line structure having a via electrically connected to the contact pad.

7. The first element of claim 1, wherein the upper surface of the conductive feature is recessed relative to the surface of the nonconductive field region by 2 nm to 20 nm.

8. A bonded structure comprising:

a first element including a first nonconductive field region having a first surface defining at least a portion of a bonding surface of the first element, and a first conductive feature having a first upper surface defining at least a portion of the bonding surface of the first element, a first lower surface opposite the first upper surface, and a first sidewall connecting and extending between the first upper surface and the first lower surface, wherein an angle between the first upper surface and the first sidewall is in a range of 30° to 70° such that the first upper surface is wider than the first lower surface; and a second element including a second nonconductive field region having a second surface directly bonded to the first surface of the first nonconductive field region, and a second conductive feature directly bonded to the first conductive feature.

9. The bonded structure of claim 8, wherein the angle between the first upper surface and the first sidewall is in a range of 30° to 60°.

10. The bonded structure of claim 8, wherein the angle between the first upper surface and the first sidewall is in a range of 35° to 50°.

11. The bonded structure of claim 8, wherein the first conductive feature is a contact pad and a thickness of the contact pad is in a range of 1 μm to 2 μm, and a width of the contact pad is in a range of 0.5 μm to 20 μm.

12. The bonded structure of claim 8, wherein the first upper surface of the first conductive feature is recessed relative to the first surface of the first nonconductive field region by 2 nm to 20 nm.

13. The bonded structure of claim 8, wherein the second conductive feature has a second upper surface directly bonded to the first conductive feature, a second lower surface opposite the second upper surface of the second conductive feature, and a second sidewall extending between the second upper surface and the second lower surface of the second conductive feature, wherein an angle between the second upper surface and the second sidewall of the second conductive feature is 75° or less.

14. A method of forming a conductive pad of an element, the method comprising:

forming a patterned resist layer over at least a portion of a surface of a dielectric layer;

removing portions of the dielectric layer by etching to form a cavity having an angle between a sidewall of the cavity and the surface of the dielectric layer, the angle being in a range of 110° to 150° such that an opening of the cavity is wider than a floor of the cavity;

providing a conductive material to at least partially fill the cavity with the conductive material; and polishing at least the surface of the dielectric layer to prepare at least a portion of a bonding surface of the element for direct bonding to a second element, and to leave the conductive material in the form of a conductive feature having an upper surface defining at least a portion of the bonding surface of the element, a lower surface opposite the upper surface, and a sidewall connecting and extending between the upper surface and the lower surface, wherein an angle between the upper surface and the sidewall is in a range of 30° to 70° such that the upper surface is wider than the lower surface.

15. The method of claim 14, wherein the patterned resist layer has a shape that conforms to a shape of the cavity, and the etching comprises dry etching.

16. The method of claim 14, wherein the etching comprises isotropic etching.

17. The method of claim 14, wherein the sidewall of the cavity has a curvature.

* * * * *